(12) United States Patent
Lee et al.

(10) Patent No.: US 11,180,410 B2
(45) Date of Patent: Nov. 23, 2021

(54) OPTICAL COATING METHOD, APPARATUS AND PRODUCT

(71) Applicant: CORNING INCORPORATED, Corning, NY (US)

(72) Inventors: Christopher Morton Lee, Corning, NY (US); Xiao-feng Lu, Jiangmen (CN); Michael Xu Ouyang, Painted Post, NY (US); Junhong Zhang, Fujian (CN)

(73) Assignee: Corning Incorporated, Corning, NY (US)

( * ) Notice: Subject to any disclaimer, the term of this patent is extended or adjusted under 35 U.S.C. 154(b) by 300 days.

(21) Appl. No.: 16/128,048

(22) Filed: Sep. 11, 2018

(65) Prior Publication Data
US 2019/0010083 A1   Jan. 10, 2019

Related U.S. Application Data

(60) Division of application No. 13/906,065, filed on May 30, 2013, now Pat. No. 10,077,207, which is a
(Continued)

(51) Int. Cl.
*C03C 17/00* (2006.01)
*B05D 1/00* (2006.01)
(Continued)

(52) U.S. Cl.
CPC ............ *C03C 17/00* (2013.01); *C03C 17/002* (2013.01); *C03C 17/42* (2013.01); *C23C 14/044* (2013.01);
(Continued)

(58) Field of Classification Search
CPC ....... C23C 14/505; C23C 14/24; C23C 14/30; C23C 14/50; C03C 17/42; C03C 17/00;
(Continued)

(56) References Cited

U.S. PATENT DOCUMENTS

| 2,338,234 A | | 1/1944 | Dimmick |
| 4,817,559 A | * | 4/1989 | Ciparisso .............. C23C 14/505 |
| | | | 118/731 |

(Continued)

FOREIGN PATENT DOCUMENTS

| CA | 2082094 | 10/1996 |
| CN | 1737191 A | 2/2006 |

(Continued)

OTHER PUBLICATIONS

Machine Translation of JP2018162776 Office Action dated Jul. 31, 2019, Japan Patent Office, 4 pgs.
(Continued)

*Primary Examiner* — Elizabeth A Burkhart
(74) *Attorney, Agent, or Firm* — Jeffrey Adolph Schmidt; William J. Tucker

(57) ABSTRACT

This disclosure is directed to an improved process for making glass articles having optical coating and easy-to clean coating thereon, an apparatus for the process and a product made using the process. In particular, the disclosure is directed to a process in which the application of the optical coating and the easy-to-clean coating can be sequentially applied using a single apparatus. Using the combination of the coating apparatus and the substrate carrier described herein results in a glass article having both optical and easy-to-clean coating that have improved scratch resistance durability and optical performance, and in addition the resulting articles are "shadow free."

24 Claims, 19 Drawing Sheets

Related U.S. Application Data continuation-in-part of application No. 13/690,829, filed on Nov. 30, 2012, now abandoned, and a continuation-in-part of application No. 13/690,904, filed on Nov. 30, 2012, now abandoned.

(60) Provisional application No. 61/709,423, filed on Oct. 4, 2012, provisional application No. 61/565,024, filed on Nov. 30, 2011.

(51) Int. Cl.

| | |
|---|---|
| C23C 14/24 | (2006.01) |
| C03C 17/42 | (2006.01) |
| C23C 14/04 | (2006.01) |
| C23C 14/12 | (2006.01) |
| C23C 14/50 | (2006.01) |
| C23C 14/56 | (2006.01) |
| B05D 5/08 | (2006.01) |

(52) U.S. Cl.
CPC .............. *C23C 14/12* (2013.01); *C23C 14/24* (2013.01); *C23C 14/505* (2013.01); *C23C 14/56* (2013.01); *B05D 1/60* (2013.01); *B05D 5/083* (2013.01); *B05D 2203/35* (2013.01); *C03C 2217/734* (2013.01); *C03C 2217/76* (2013.01); *C03C 2217/78* (2013.01); *C03C 2218/151* (2013.01); *C03C 2218/32* (2013.01)

(58) Field of Classification Search
CPC ......... C03C 17/002; G02B 1/115; G02B 1/18; B05D 1/60
USPC .................................................. 427/162–169
See application file for complete search history.

(56) References Cited

U.S. PATENT DOCUMENTS

| | | | |
|---|---|---|---|
| 4,851,095 | A | 7/1989 | Scobey et al. |
| 5,026,469 | A | 6/1991 | Kunkel et al. |
| 5,105,310 | A | 4/1992 | Dickey |
| 5,106,346 | A | 4/1992 | Locher et al. |
| 5,328,768 | A * | 7/1994 | Goodwin .............. C03C 17/328 428/428 |
| 5,342,665 | A | 8/1994 | Krawitz |
| 5,352,294 | A | 10/1994 | White et al. |
| 5,699,189 | A | 12/1997 | Murphy |
| 5,759,643 | A | 6/1998 | Miyashita et al. |
| 5,783,299 | A | 7/1998 | Miyashita et al. |
| 5,800,918 | A | 9/1998 | Chartier et al. |
| 6,119,626 | A | 9/2000 | Miyazawa et al. |
| 6,264,751 | B1 | 7/2001 | Kamura et al. |
| 6,296,793 | B1 | 10/2001 | Anthes et al. |
| 6,383,565 | B1 | 5/2002 | Monaghan |
| 6,405,465 | B2 | 6/2002 | Dwyer et al. |
| 6,592,659 | B1 | 7/2003 | Terrazas et al. |
| 6,749,750 | B2 | 6/2004 | Barbera-Fuillem et al. |
| 6,863,965 | B2 | 3/2005 | Fujinawa et al. |
| 6,929,822 | B2 | 8/2005 | Kono |
| 7,070,849 | B2 | 7/2006 | Mori et al. |
| 7,294,731 | B1 | 11/2007 | Flynn |
| 7,508,567 | B1 | 3/2009 | Clark |
| 7,578,877 | B2 | 8/2009 | Giessler et al. |
| 7,604,358 | B2 | 10/2009 | Ninomiya et al. |
| 7,692,855 | B2 | 4/2010 | Arrouy et al. |
| 7,790,004 | B2 | 9/2010 | Seddon |
| 7,889,284 | B1 | 2/2011 | Nemeth et al. |
| 7,967,961 | B2 | 6/2011 | Dogi et al. |
| 8,211,544 | B2 | 7/2012 | Itami et al. |
| 8,318,245 | B2 | 11/2012 | Roisin et al. |
| 8,475,595 | B2 | 7/2013 | Pei |
| 8,817,376 | B2 | 8/2014 | Lee et al. |
| 2001/0022652 | A1 | 9/2001 | Van Schaik et al. |
| 2001/0033893 | A1 | 10/2001 | Anthes et al. |
| 2002/0050453 | A1 | 5/2002 | Monaghan |
| 2002/0060848 | A1 | 5/2002 | Mitsuishi et al. |
| 2003/0003227 | A1 | 1/2003 | Kono |
| 2003/0116872 | A1 | 6/2003 | Klemm et al. |
| 2003/0165698 | A1 | 9/2003 | Vaneeckhoutte et al. |
| 2003/0180544 | A1 | 9/2003 | Murphy |
| 2003/0234460 | A1 | 12/2003 | Hayashi et al. |
| 2004/0043260 | A1 | 3/2004 | Nadaud et al. |
| 2004/0076750 | A1 | 4/2004 | Boulineau et al. |
| 2004/0142185 | A1 * | 7/2004 | Takushima .............. G02B 1/111 428/447 |
| 2004/0182701 | A1 | 9/2004 | Miyamura |
| 2005/0008778 | A1 | 1/2005 | Utsugi et al. |
| 2005/0158910 | A1 | 7/2005 | Jiang et al. |
| 2006/0049044 | A1 * | 3/2006 | Seddon .................. C23C 14/505 204/298.23 |
| 2006/0118408 | A1 | 6/2006 | Myli et al. |
| 2006/0158738 | A1 | 7/2006 | Nakamura et al. |
| 2006/0181774 | A1 | 8/2006 | Ojima et al. |
| 2006/0269663 | A1 | 11/2006 | Mori |
| 2007/0104891 | A1 | 5/2007 | Fournand |
| 2007/0184183 | A1 | 8/2007 | Chu et al. |
| 2007/0190342 | A1 | 8/2007 | Teng |
| 2008/0002260 | A1 | 1/2008 | Arrouy et al. |
| 2008/0007849 | A1 | 1/2008 | Meschenmoser et al. |
| 2008/0050600 | A1 | 2/2008 | Fan et al. |
| 2008/0095999 | A1 | 4/2008 | Yoshihara et al. |
| 2008/0121335 | A1 | 5/2008 | Kiuchi et al. |
| 2008/0187766 | A1 | 8/2008 | Heider et al. |
| 2008/0206470 | A1 | 8/2008 | Thomas et al. |
| 2008/0213473 | A1 | 9/2008 | Roisin et al. |
| 2008/0025999 | A1 | 10/2008 | O'Brien |
| 2008/0250955 | A1 | 10/2008 | O'Brien |
| 2009/0098309 | A1 | 4/2009 | Brody et al. |
| 2009/0104385 | A1 | 4/2009 | Reymond et al. |
| 2009/0197048 | A1 * | 8/2009 | Amin .................. C03C 17/30 428/142 |
| 2009/0208728 | A1 | 8/2009 | Itami et al. |
| 2009/0216035 | A1 | 8/2009 | Itami et al. |
| 2009/0226610 | A1 | 9/2009 | Koenig et al. |
| 2009/0257022 | A1 | 10/2009 | Abe et al. |
| 2010/0053547 | A1 | 3/2010 | Baude et al. |
| 2010/0062217 | A1 | 3/2010 | Kurematsu |
| 2010/0173149 | A1 | 7/2010 | Hung |
| 2010/0238557 | A1 | 9/2010 | Tomoda |
| 2010/0304086 | A1 | 12/2010 | Carre et al. |
| 2011/0097511 | A1 * | 4/2011 | Shiono .................. C23C 14/10 427/523 |
| 2011/0100806 | A1 * | 5/2011 | Sugawara .............. C23C 14/505 204/298.06 |
| 2011/0198219 | A1 | 8/2011 | Ohmi et al. |
| 2011/0232749 | A1 | 9/2011 | Lienhart et al. |
| 2011/0305874 | A1 | 12/2011 | Thoumazet et al. |
| 2012/0009429 | A1 | 1/2012 | Shmueli et al. |
| 2012/0013845 | A1 | 1/2012 | Conte et al. |
| 2012/0109591 | A1 | 5/2012 | Thompson et al. |
| 2012/0162095 | A1 | 6/2012 | Liang et al. |
| 2012/0275026 | A1 | 11/2012 | Zhou et al. |
| 2013/0025503 | A1 | 1/2013 | Park et al. |
| 2014/0113083 | A1 | 4/2014 | Lee et al. |

FOREIGN PATENT DOCUMENTS

| | | |
|---|---|---|
| CN | 1737192 A | 2/2006 |
| CN | 1244165 C | 3/2006 |
| CN | 101501045 A | 8/2009 |
| CN | 101939266 A | 1/2011 |
| CN | 101512389 | 3/2011 |
| EP | 614957 A1 | 9/1994 |
| EP | 1136973 A1 | 9/2001 |
| EP | 1255129 A2 | 11/2002 |
| EP | 0933377 B1 | 11/2004 |
| EP | 1630261 A2 | 3/2006 |
| EP | 1328579 B1 | 3/2012 |
| JP | 50003454 | 1/1975 |
| JP | 5843402 | 3/1983 |
| JP | 03-044607 A | 2/1991 |
| JP | 6029332 B | 4/1994 |

(56) References Cited

FOREIGN PATENT DOCUMENTS

| | | |
|---|---|---|
| JP | 07145481 A | 6/1995 |
| JP | 10036142 A | 2/1998 |
| JP | 200180941 A | 3/2001 |
| JP | 2003-014904 A | 1/2003 |
| JP | 2004-250784 A | 9/2004 |
| JP | 2006-057185 A | 3/2006 |
| JP | 2006055731 | 3/2006 |
| JP | 2006171204 A | 6/2006 |
| JP | 2007240707 A | 9/2007 |
| JP | 20081869 A | 1/2008 |
| JP | 04147518 B2 | 9/2008 |
| JP | 2009-541808 A | 11/2009 |
| JP | 2009299129 | 12/2009 |
| JP | 2011-510904 A | 4/2011 |
| JP | 2011202190 A | 10/2011 |
| TW | 578004 | 3/2004 |
| TW | 200415679 A | 8/2004 |
| TW | 200420979 | 10/2004 |
| TW | 201109459 A | 3/2011 |
| TW | 201137137 A | 11/2011 |
| WO | 2011060047 A1 | 5/2001 |
| WO | 2006/025336 A1 | 3/2006 |
| WO | 2006107083 A2 | 10/2006 |
| WO | 2009043122 A1 | 4/2009 |
| WO | 2012064989 A1 | 5/2012 |
| WO | 2012137744 A1 | 10/2012 |
| WO | 2012176990 A1 | 12/2012 |
| WO | 2013099824 A1 | 7/2013 |
| WO | 2013121984 | 8/2013 |
| WO | 2013121985 | 8/2013 |
| WO | 2013121986 | 8/2013 |

OTHER PUBLICATIONS

Calottes R Willy, Practical Design and Production of Optical Thin Films; Mercel Dekker 1966, pp. 115-121.
Choy et al.; Handbook of Nanostructured Materials and Nanotechnology, vol. 1: Synthesis and Processing. Academic Press; 2000. p. 533.
CN201280068319.7 Office Action dated Jan. 27, 2016.
CN201280068398.1 Office Action dated Feb. 1, 2016.
EP12798577.8 Search Report dated Apr. 12, 2016.
Fuchs, et al, "Wetting & Surface Properties of (Modified) Fluoro-Silanised Glass"; Collioids and Surfaces A: Physicochem Eng. Aspects 307 (2007) 7-15.
International Search Report and Written Opinion of the International Searching Authority; PCT/US2012/067370; dated Jul. 10, 2013; 10 pages.
International Search Report and Written Opinion of the International Searching Authority; PCT/US2012/067383; dated Jul. 8, 2013, 11 pages.
International Search Report and Written Opinion of the International Searching Authority; PCT/US2013/043415; dated Oct. 23, 2013.
JP2014544942 Office Action dated Nov. 15, 2016, Japan Patent Office.
Kondo et al; ""Durable Anti-Smudge Materials for Display Terminals"";http://www.findarticles.com/p/articles/mi qa5322/is 200906/ai n3212753 1/.
MacLeod, "Thin Film Optical Filters", 3rd Edition, Institute of Physics Publishing. Beistol and Philadelphia, 2001.
Martinet et al; "Deposition of SI02 and TI02 Thin Films By Plasma Enchanced Chemical Vapor Deposition for Antireflection Coating"; Journal of Non-Crystalling Solids 216 (1997) 77-82.
Taiwan Office Action 101145139 dated Jun. 23, 2016, 5 pgs.
TW102119804 Search Report dated Jan. 25, 2017, Taiwan Patent Office.
TW105137761 Search Report dated Jul. 25, 2017, Taiwan Patent Office.
English Translation of JP2014544939 Office Action dated Dec. 27, 2016, Japan Patent Office.
Machine translation JP2001080941.
Machine Translation of CN 1244165C, 21 pages.
Machine Translation of EP0614957, 10 pages.
Machine Translation of JP2006055731, 15 pages.
Machine Translation of JP2009299129, 10 pages.
Machine Translation of JP6029332, 12 pages.
Machine translation WO2012176990.

* cited by examiner

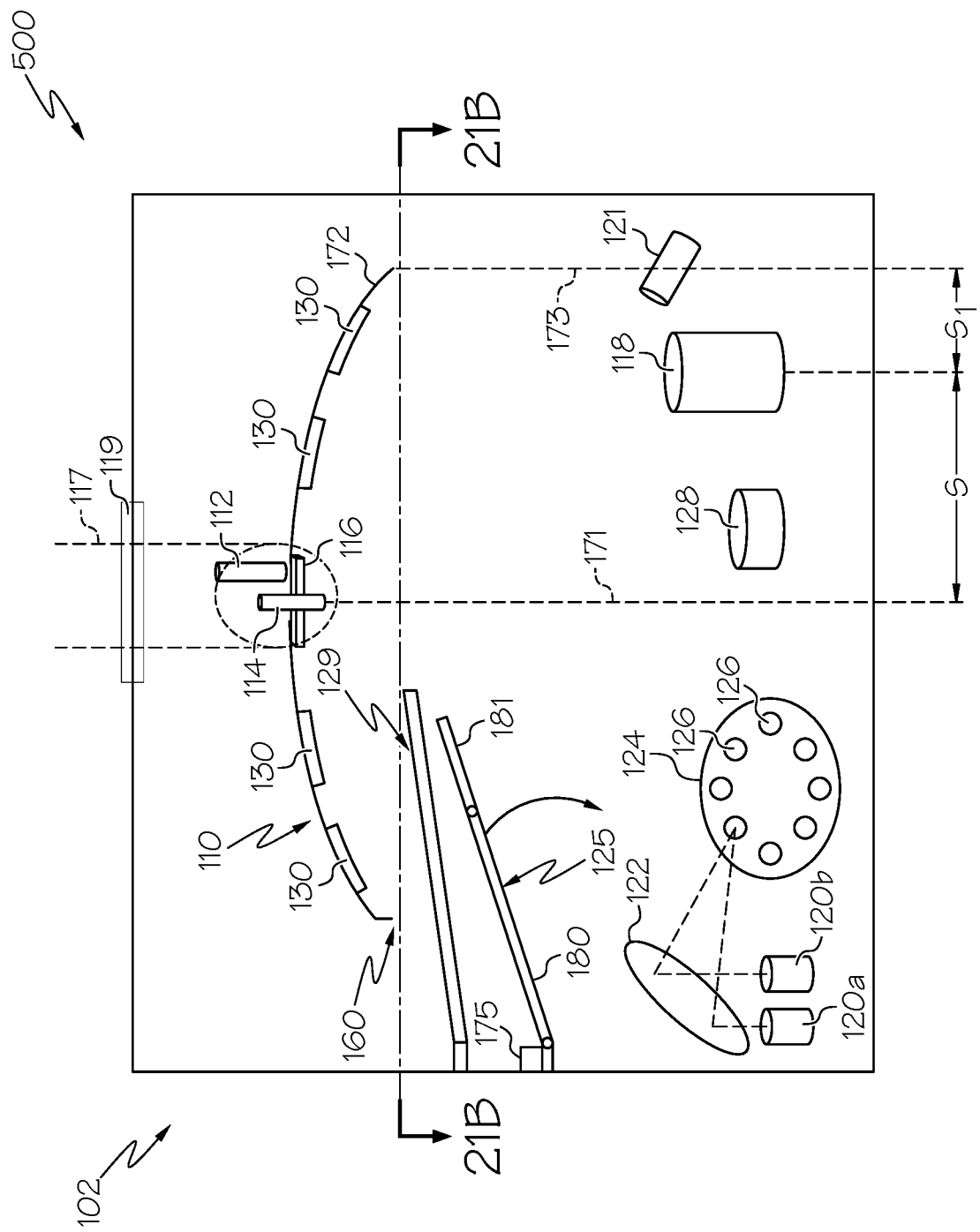

OPTICAL COATING METHOD, APPARATUS AND PRODUCT

CROSS-REFERENCE TO RELATED APPLICATIONS

This application is a divisional application and claims the benefit of priority to U.S. Non-Provisional application Ser. No. 13/906,065 filed on May 30, 2013 (now U.S. Pat. No. 10,077,207) and is a continuation-in-part of U.S. Non-Provisional patent application Ser. No. 13/690,829 filed Nov. 30, 2012 (now abandoned) entitled "Optical Coating Method, Apparatus and Product", which claims the priority of U.S. Provisional Application No. 61/709,423 entitled "Optical Coating Method, Apparatus and Product" filed Oct. 4, 2012, the contents of which are relied upon and incorporated herein by reference in its entirety. Further, this application is a continuation-in-part of U.S. Non-Provisional patent application Ser. No. 13/690,904 filed Nov. 30, 2012 (now abandoned) entitled "Process for Making of Glass Articles with Optical and Easy-To-Clean Coatings", which claims the priority of U.S. Provisional Application No. 61/565,024 entitled "Process for Making of Glass Articles With Optical and Easy-To-Clean Coatings" filed Nov. 30, 2011, the contents of which are relied upon and incorporated herein by reference in its entirety.

FIELD

This disclosure is directed to a process for making glass articles having an optical coating and an easy-to-clean (ETC) coating thereon, an apparatus for performing the process and an article made using the process. In particular, the disclosure is directed to a process in which the application of the optical coating and the ETC coating can be sequentially carried out using the same apparatus.

BACKGROUND

Glass, and in particular chemically strengthened glass, has become the material of choice for the view screen of many, if not most, consumer electronic products. For example, chemically strengthened glass is particularly favored for "touch" screen products whether they be small items, such as cell phones, music players, eBook readers and electronic notepads, or larger items, such as computers, automatic teller machines, airport self-check-in machines and other similar electronic items. Many of these items require the application of antireflective ("AR") coatings on the glass in order to reduce the reflection of visible light from the glass and thereby improve contrast and readability, for example, when the device is used in direct sunlight. However, some of the drawbacks of an AR coating are its sensitivity to surface contamination and its poor anti-scratch durability, that is, the AR coating becomes easily scratched during use, for example, by a wiping cloth or the dirt and grime on a user's finger. Fingerprints and stains are very noticeable on an AR coated surface and are not always easily removed. As a result, it is highly desirable that the glass surface of any touch device be easy to clean which is achieved by applying an easy-to-clean (ETC) coating to the glass surface.

The current processes for making glass articles having both antireflection and ETC coatings require that the coating be applied using different equipment, and consequently separate manufacturing runs. The basic procedure is to apply the antireflection ("AR") coating to a glass article using, for example, a chemical vapor ("CVD") or physical vapor deposition ("PVD") method. In conventional processes, an optically coated article, for example, one with an AR coating, will be transferred from the optical coating apparatus to another apparatus to apply the ETC coating on top of the AR coating. While these processes can produce articles that have both an AR and an ETC coating, they require separate runs and have higher yield losses due to the extra handling that is required. This may result in poor reliability of the final product due to contamination arising from the extra handling between the AR coating and ETC coating procedures. For example, using the conventional 2-step coating process of ETC over an optical coating results in an article that is easily scratched in touch screen applications. In addition, while the AR coated surface can be cleaned before applying the ETC coating, this involves additional steps in the manufacturing process. All the additional steps increase the product costs. Consequently, alternative methods and apparatuses are needed by which both coatings can be applied using the same basic procedure and equipment, thus reducing manufacturing costs. Advantages of the process disclosed herein and the resulting products are set forth in the following paragraphs and claims.

SUMMARY

In one or more embodiments, the disclosure provides a substrate carrier for holding a substrate during a coating process. The substrate carrier may include a substrate carrier base comprising a retention surface, an underside, and a substrate retention area disposed on the retention surface. The substrate retention area may have an area less than an area of the retention surface. The substrate carrier may also include a plurality of magnets coupled to the underside of the substrate carrier base and positioned outside of a perimeter of the substrate retention area. In one or more embodiments, the adhesive material may be positioned over the retention surface in the substrate retention area for releasably affixing at least one substrate to be coated to the retention surface. The adhesive material may include a pressure sensitive adhesive. In one variant, the adhesive material may include acrylic adhesives, rubber adhesives, and/or silicone adhesives. Optionally, a polymer film may be positioned between the retention surface and the adhesive material.

The substrate carrier may include a plurality of pins for supporting a substrate positioned on the retention surface. Optionally, the substrate carrier may include a spring system comprising a retractable pin held in place by a spring which biases the retractable pin into contact with the substrate when the substrate is positioned on the retention surface, and a plurality of side stoppers extending from the substrate carrier base for a distance such that, when the substrate is positioned on the plurality of pins, tops of the plurality of side stoppers are below a top surface of the substrate. In one variant, the substrate carrier may be a housing with a retractable pin disposed in the housing, wherein the retractable pin is held in place by a spring, the retractable pin being outwardly biased from the housing and into contact with the substrate when the substrate is positioned on the retention surface and a plurality of movable pins for holding an edge of the substrate when the substrate is positioned on the retention surface. In another variant, the positions of the plurality of pins are adjustable to accommodate substrates of different shapes and dimensions.

In yet another embodiment, the disclosure provides a coating apparatus for coating a substrate. The coating apparatus may include a vacuum chamber and a rotatable dome positioned in the vacuum chamber and comprising a magnetic material. A plasma source may be positioned within the vacuum chamber and substantially vertically oriented to direct plasma onto an underside of the rotatable dome, wherein the plasma source is positioned below the rotatable dome and radially outward from an axis of rotation of the rotatable dome such that the plasma emitted from the plasma source is incident on the underside of the rotatable dome from at least an outer edge of the rotatable dome to at least a center of the rotatable dome. In one or more embodiments, the distance between the axis of rotation of the rotatable dome and the plasma source is greater than a distance between a projected perimeter of the rotatable dome and the plasma source. The coating apparatus may include at least one thermal evaporation source positioned in the vacuum chamber.

The coating apparatus may optionally include at least one e-beam source positioned in the vacuum chamber and oriented to direct an electron beam onto coating source materials positioned in the vacuum chamber. The coating apparatus may include a second e-beam source in the vacuum chamber. The second e-beam source may be oriented to direct a second electron beam onto coating source materials positioned in the vacuum chamber.

In another option, the coating apparatus may include at least one shadow mask adjustably positionable within the vacuum chamber. The shadow mask may be adjustable from an extended position, wherein the at least one shadow mask is positioned between the at least one e-beam source and the rotatable dome, and a retracted position, wherein the at least one shadow mask is not positioned between the at least one e-beam source and the rotatable dome. In one or more embodiments, a second shadow mask may be included. In such embodiments, the second shadow mask may be positioned between the second e-beam source and the rotatable dome.

The coating apparatus may include a rotatable dome that includes an opening at a top center of the rotatable dome, a transparent glass plate covering the opening of the rotatable dome, and a monitor positioned in an opening in the transparent glass plate for monitoring a deposition rate of coating material deposited in the vacuum chamber. An optical fiber may be positioned above the transparent glass plate, wherein the optical fiber collects light reflected from the transparent glass plate as the transparent glass plate is coated to determine a change in reflectance of the transparent glass plate and thereby a thickness of coatings applied to the transparent glass plate.

In yet another embodiment, the disclosure provides a coating apparatus for coating a substrate. The coating apparatus may include a vacuum chamber and a rotatable dome positioned in the vacuum chamber. The rotatable dome may be constructed from a magnetic material. The apparatus may also include at least one substrate carrier for attachment to the rotatable dome. The at least one substrate carrier may include a substrate carrier base comprising a retention surface, an underside, and a substrate retention area disposed on the retention surface. A plurality of magnets may be coupled to the underside of the substrate carrier base and positioned outside of a perimeter of the substrate retention area. An adhesive material may be positioned over the retention surface in the substrate retention area for releasably affixing at least one substrate to be coated. The coating apparatus may include a plasma source positioned within the vacuum chamber and substantially vertically oriented to direct plasma onto an underside of the rotatable dome, wherein the plasma source is positioned below the rotatable dome and radially outward from an axis of rotation of the rotatable dome such that the plasma emitted from the plasma source is incident on the underside of the rotatable dome from at least an outer edge of the rotatable dome to at least a center of the rotatable dome. In one variant, the distance between the axis of rotation of the rotatable dome and the plasma source is greater than a distance between a projected perimeter of the rotatable dome and the plasma source. The coating apparatus may include a first e-beam source positioned in the vacuum chamber and oriented to direct a first electron beam onto a first coating source material positioned in the vacuum chamber and a second e-beam source positioned in the vacuum chamber and oriented to direct a second electron beam onto a second coating source material positioned in the vacuum chamber. The first coating source material may exhibit a high refractive index and the second coating source material may exhibit a low refractive index or a medium refractive index. The coating apparatus may include at least one shadow mask adjustably positionable within the vacuum chamber. The shadow mask may be adjustable from an extended position, wherein the at least one shadow mask is positioned between at least one of the first e-beam source and the second e-beam source and the rotatable dome and a retracted position, wherein the at least one shadow mask is not positioned between either the first e-beam source or the second e-beam source and the rotatable dome.

Additional features and advantages of the methods described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein, and together with the descriptions, serve to explain the principles and operations of the claimed subject matter.

BRIEF DESCRIPTION OF THE DRAWINGS

FIG. 4B is a side view of FIG. 4A illustrating a glass substrate 140 resting on pins 136 that extend into the substrate carrier base 131 for a distance from the substrate carrier surface 131a, a plurality of magnets 134 that extend from the surface 131a of the substrate carrier 130 and through the substrate for a distance beyond the base 131, and a side stopper 150 extending from the base of carrier 130 for a distance from glass article 140's top face 140a;

FIG. 21A schematically depicts a vertical cross section of one embodiment of a coating apparatus;

DETAILED DESCRIPTION

Figure 1A:
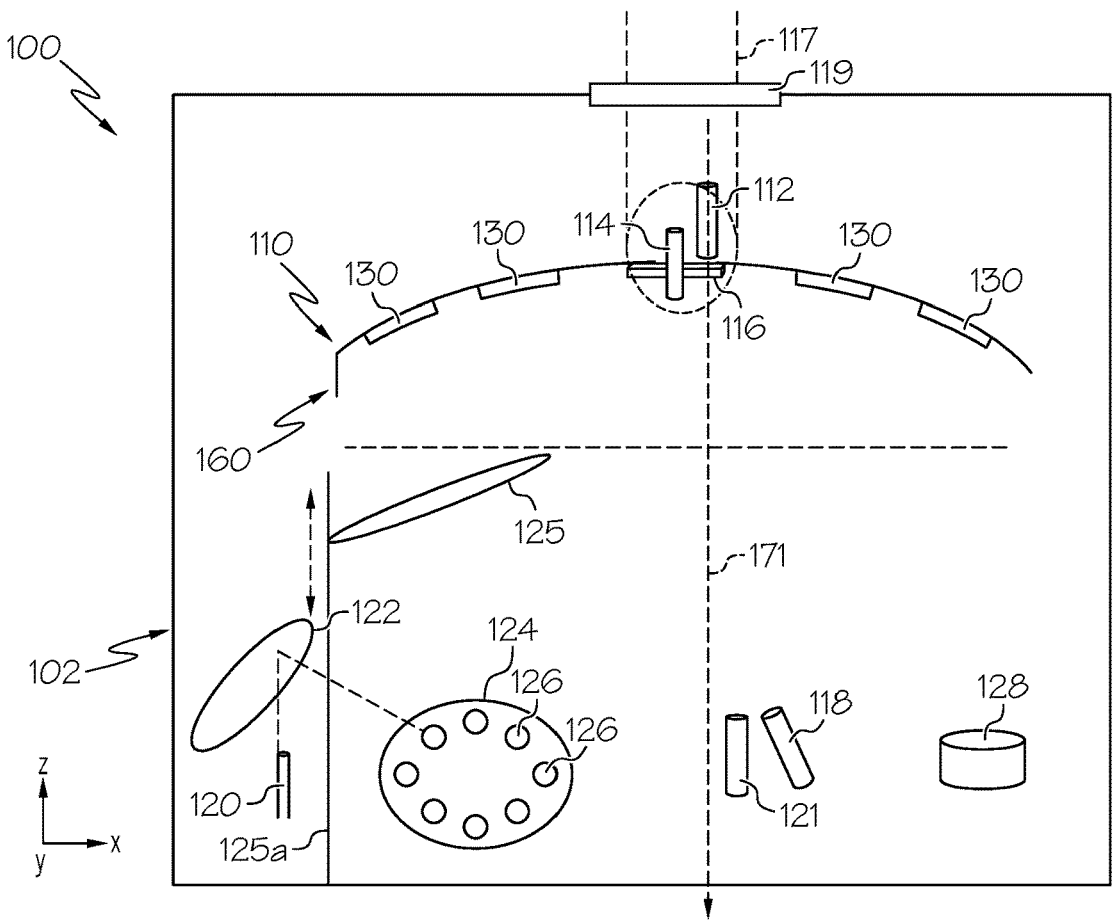
FIG. 1A is a schematic drawing of a coating apparatus 100 according to one or more embodiments described herein.

Reference will now be made in detail to embodiments of glass articles coated with optical coatings and easy-to-clean coatings and methods and apparatuses for forming the same, examples of which are illustrated in the accompanying drawings. Whenever possible, the same reference numerals will be used throughout the drawings to refer to the same or like parts. One embodiment of a coating apparatus is schematically depicted in FIG. 1A. The coating apparatus generally includes a vacuum chamber with a magnetic dome positioned therein. The coating apparatus also includes an e-beam source, a thermal evaporation source and a plasma source. Glass substrates to be coated can be magnetically attached to an underside of the dome and coated with an optical coating and an ETC coating using the e-beam source and the thermal evaporation source, respectively. In embodiments, the plasma source may be used to densify the deposited optical coating materials. Various embodiments of apparatuses and methods for sequentially applying optical coatings and ETC coatings to glass substrates will be described in more detail herein with specific reference to the appended drawings.

Herein the terms "process" and "method" may be used interchangeably. Also herein the terms "shadowless" and "shadow free" mean that the optical coating is uniformly deposited over the entire surface of the glass substrate such that, when the glass article with the coating deposited using the methods and apparatuses described herein is viewed, the shadow that is observed on glass articles having optical coating prepared using conventional optical coating methods and apparatuses is not observed. The shadow observed on conventionally coated glass articles arises when areas of the substrate being coated shield the surface of the substrate from the deposition of the optical coating materials. These shadows are frequently observed adjacent to elements that are used to hold the substrate being coated in place during the coating process or are on the substrate carrier for transport of the carrier and the elements being coated into and out of the coater.

The terms "glass article" and "glass substrate" are used herein interchangeably and generally refer to any glass item coated using the methods and apparatuses described herein.

The present disclosure is directed to a process in which both an optical coating, for example an AR coating, comprising alternating layers of high refractive index and low refractive index materials, and an ETC coating, for example a perfluoroalkylsilane coating, can be applied to a glass substrate in sequential steps (i.e., first applying the optical coating and then applying the ETC coating over the optical coating) using substantially the same procedure without exposing the article to air or ambient atmosphere at any time during the application of the optical coating and the ETC coating. A reliable ETC coating provides lubrication to surface(s) of glass, transparent conductive coatings (TCC), and optical coatings. In addition, the abrasion resistance of glass and optical coatings will be more than 10 times better than the conventional coating process or 100-1000 times better than an AR coating without an ETC coating by using an in-situ, one-step process in which the coatings are sequentially applied, as graphically depicted in FIGS. 10, 11, and 17B. Using such techniques, the ETC coating can be considered as part of the optical coating during design and, as such, the ETC coating will not change the desired optical performance. The glass articles described herein are shadow free across the optically coated surfaces of the glass.

A particular example of an in-situ process is a box coater, as schematically depicted in FIG. 1A. The box coater is equipped with an electron beam (e-beam) source for optical coatings, a thermal evaporation source for the ETC coating material, and an ion beam or a plasma source for surface cleaning before coating and optical coating impaction during coating to increase the density of the coating and the smoothness of the coating surface.

The optical coating is composed of high and median or low refractive index materials. Exemplary high index materials having an index of refraction greater than or equal to 1.7 and less than or equal to 3.0 include: $ZrO_2$, $HfO_2$, $Ta_2O_5$, $Nb_2O_5$, $TiO_2$, $Y_2O_3$, $Si_3N_4$, $SrTiO_3$, and $WO_3$; an exemplary median index material having an index of refraction greater than or equal to 1.5 and less than 1.7 is $Al_2O_3$; and exemplary low index materials having an index of refraction greater than or equal to 1.3 and less than or equal to 1.6) include: $SiO_2$, $MgF_2$, $YF_3$, and $YbF_3$. The optical coating stack that is deposited on a substrate comprises at least one material/layer to provide a specified optical function. In most cases, a high and a low index material can be used to design a complex optical filter (including AR coatings), for example, $HfO_2$ as the high index material and $SiO_2$ as the low index material. TCC (two-component coating) materials suitable for use in the coatings include ITO (indium tin oxide), AZO (Al doped zinc oxide), IZO (Zn stabilized indium oxides), $In_2O_3$, and similar binary and ternary oxide compounds.

In embodiments, the optical coatings are applied to glass substrates using PVD coating (sputtered or IAD-EB coated optical coating with thermal evaporation of the ETC coating). PVD is a "cold" process in which the substrate temperature is under 100° C. As a result, there is no degradation of the strength of a chemically strengthened or tempered glass substrate to which the coatings are applied.

In the embodiments described herein, the glass used to make the shadow free, optical and ETC coated glass articles described herein may be an ion-exchanged or non-ion-exchanged glass. Exemplary glasses include silica glass, aluminosilicate glass, borosilicate glass, aluminoborosilicate glass and soda lime glass. The glass articles have a thickness in the range of 0.2 mm to 1.5 mm, and a length and width suitable for the intended purpose. Thus the length and width of the glass article can range from that of a cell phone to a tablet computer, or larger.

The optical coatings referred to herein include antireflection coatings (AR coatings), band-pass filter coatings, edge neutral mirror coatings, beam splitters, multi-layer high-reflectance coatings and edge filters, as described in H. Angus Macleod, "Thin Film Optical Filters", $3^{rd}$ edition, Institute of Physics Publishing, Bristol and Philadelphia, 2001. Applications using such optical coatings include displays, camera lenses, telecommunications components, instruments, medical devices, photochromic and electrochromic devices, photovoltaic devices, and other elements and devices.

Alternating layers of high and low refractive index materials can be used to form optical coatings, such as antireflective or anti-glare for ultraviolet ("UV"), visible ("VIS") and infrared ("IR") applications. The optical coatings can be deposited using a variety of methods. Herein the PVD method (i.e., ion-assisted, e-beam deposition) for depositing the optical coatings is used as an exemplary method. The optical coatings comprise at least one layer of a high index material H and at least one layer of low index material L. Multilayer coatings consist of a plurality of alternating high and low index layers, for example, HL, HL, HL . . . , etc., or LH, LH, LH . . . , etc. One pair of HL layers (or LH layers) is referred to as a "period" or a "coating period." A medium index material M can be used in place of a low index material in all or some of the low index layers. The term "index," as used herein, refers to the index of refraction of the material. In a multilayer coating, the number of periods can range widely depending on the function of the intended product. For example, for AR coatings, the number of periods can be in the range of greater than or equal to 2 and less than or equal to 20. An optional final capping layer of $SiO_2$ can also be deposited on top of the AR coating as a final layer. Various techniques may be used to deposit the ETC material on top of the optical coating without exposing the optical coating to the ambient atmosphere including, without limitation, thermal evaporation, chemical vapor deposition (CVD) or atomic layer deposition (ALD).

The optical coatings deposited on the glass substrates described herein may be multilayer optical coatings comprising at least one period of a high refractive index material and a low refractive index material. The high refractive index material may be selected from $ZrO_2$, $HfO_2$, $Ta_2O_5$, $Nb_2O_5$, $TiO_2$, $Y_2O_3$, $Si_3N_4$, $SrTiO_3$, and $WO_3$; however, it should be understood that other suitable high refractive index materials may be used. The low refractive index material may be selected from the group consisting of $SiO_2$, $MgF_2$, $YF_3$, and $YbF_3$; however, it should be understood that other suitable low refractive index materials may be used. In some embodiments, the low refractive index material may be replaced with a medium refractive index material, such as $Al_2O_3$ or another suitable medium refractive index material.

In one embodiment, the present disclosure is directed to a process in which, in a first step, a multilayer optical coating is deposited on a glass substrate followed by a second step in which the ETC coating is thermally evaporated and deposited in the same chamber as the optical coating. In another embodiment, a multilayer optical coating is deposited on a glass substrate in one chamber followed by the thermal evaporation and deposition of the ETC coating on top of the multilayer coating in a second chamber, with the provision that the transfer of the multilayer coated substrate from the first chamber to the second chamber is carried out inline in a manner such that the substrate is not exposed to air between the application of the multilayer coating and the ETC coating. The coating techniques utilized may include, without limitation PVD, CVD/PECVD, and ALD coating techniques. Depending on the size of the chamber or chambers and the size of the substrates being coated, one or a plurality of substrates can simultaneously be coated within a single chamber.

The multilayer optical coatings are typically oxide coatings in which the high index coating is a lanthanide series oxide, such as La, Nb, Y, Gd or other lanthanide metals, and the low index coating is $SiO_2$. The ETC materials may be, for example, fluorinated silanes, typically alkyl perfluorocarbon silanes having the formula $(R_f)SiX_{4-x}$, where $R_f$ is a linear $C_6$-$C_{30}$ alkyl perfluorocarbon, X=Cl or —$OCH_3$— and x=2 or 3. The fluorocarbons have a carbon chain length in the range of greater than or equal to 3 nm and less than or equal to 50 nm. The fluorocarbons can be obtained commercially from vendors including, without limitation, Dow-Corning (for example, fluorocarbons 2604 and 2634), 3M Company (for example, ECC-1000 and 4000), Daikin Corporation, Canon, Don (South Korea), Ceko (South Korea), Cotec-GmbH (for example, DURALON UltraTec) and Evonik.

Figure 2:
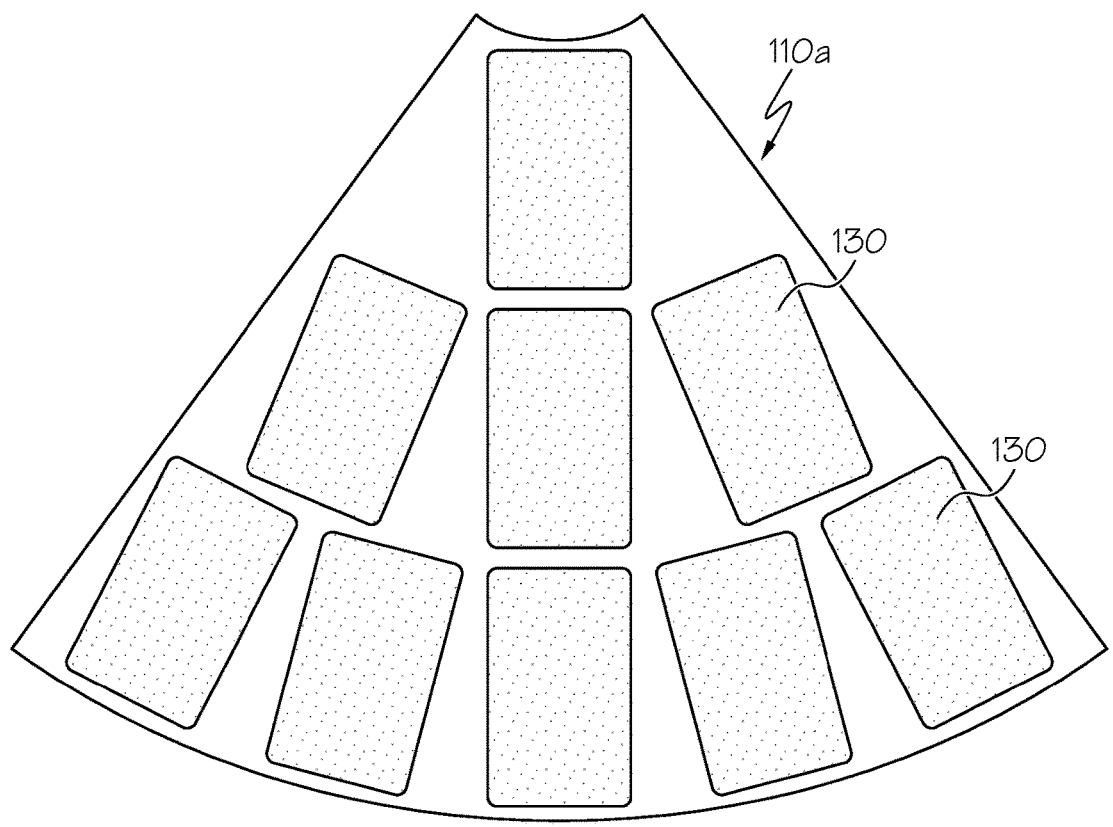
FIG. 2 is a drawing representing a top-down view through a section of the dome of the coating apparatus of FIG. 1A illustrating a plurality of substrate carriers magnetically attached to the dome.

FIG. 1A schematically depicts a coating apparatus 100 and various operating elements of the apparatus according to one or more embodiments disclosed herein. Coordinate axes are provided for reference. In a frontal view, x is from side-to-side (i.e., left to right), y is from front-to-back (i.e., in and out of the page) and z is from bottom-to-top. The coating apparatus 100 generally comprises a vacuum chamber 102 having therein a rotatable dome 110 with lip 161 (depicted in FIG. 3A) that is part of a frame 160 (further illustrated in FIG. 3B) that supports dome 110. The dome includes a plurality of substrate carriers 130 magnetically attached to an underside of the dome as illustrated in FIG. 2. A plasma source 118 is located in the vacuum chamber 102 below the dome 110 and is generally oriented to emit ions or plasma upwards, towards the underside of the dome 110. The plasma source is used to densify the optical coating materials as they are deposited and/or after deposition thereby increasing the hardness of the finished optical coating. Specifically, the ions or plasma emitted from the plasma source impact the coating during deposition and/or after a coating layer has been applied resulting in a densification of the deposited material. Densifying the deposited optical coating improves the abrasion resistance of the optical coating. For example, in some embodiments, the deposited optical coating will have at least double the abrasion reliability or abrasion resistance of an optical coating deposited without the use of a plasma source. The plasma source 118 may be used in conjunction with a neutralizer 121, as described in more detail herein with respect to FIG. 21A.

The coating apparatus further comprises an e-beam source 120 located below the dome 110 and an e-beam reflector 122 for directing the e-beam from the e-beam source toward the optical coating material being applied to the glass substrate to thereby vaporize the optical material. A shadow mask 125 for enabling uniform coating across the dome is located below the dome 110. The shape and position of the shadow mask 125 are adjustable such that the shadow mask is "tunable" to achieve a desired coating uniformity. The shadow mask 125 is positioned on a support 125a such that the position of the shadow mask 125 can be adjusted vertically along the support 125a, as indicated by the dashed double headed arrow. The position of the shadow mask 125 on the support 125a can be adjusted as needed to prevent the shadow mask from shielding the glass substrates located on the underside of the dome 110 from the ions or plasma emitted from the plasma source 118 as the optical coating is applied. While FIG. 1A depicts a single e-beam source 120, it should be understood that a plurality of e-beam sources can be used to minimize the time to change from one coating material to another, for example, changing from $Nb_2O_5$ to $SiO_2$ and back again, as required to deposit the required number of individual layers of material for the optical coating. For example, in some embodiments, the coating apparatus may comprise greater than or equal to 2 e-beam sources and less than or equal to 6 e-beam sources. When a plurality of e-beam sources are used, each e-beam source may be directed to a separate container (i.e., the boats 126, described further herein) holding the material to be coated.

The coating apparatus 100 further comprises an optical coating carrier 124 having a plurality of boats 126 which contain the optical coating material. The boats 126 are separate source containers used to contain the different materials used to deposit the optical coating layer. The optical coating carrier 124 is positioned in the vacuum chamber 102 such that an e-beam emitted from the e-beam source 120 can be reflected by the e-beam reflector 122 onto the optical coating material contained in the boats 126, thereby vaporizing the optical coating material. The boats 126 contain different optical coating materials so that only one type of coating material (e.g., either a high refractive index, low refractive index, or medium refractive index material), is applied at one time. After the proper thickness of one coating material is reached, the lid (not depicted) of the corresponding boat is closed and a lid to another boat containing a different coating material to be applied is opened. In this manner, the high refractive index material, low refractive index material, or medium refractive index material can be applied in an alternating manner to form an optical coating material having the desired optical properties.

The coating apparatus 100 also comprises at least one thermal evaporation source 128 for evaporating the ETC coating material to facilitate depositing the coating material onto glass substrates retained on the underside of the dome 110. The at least one thermal evaporation source 128 is positioned in the vacuum chamber 102 below the dome 110. In one or more embodiments, the ETC coating may be provided in the vacuum chamber 102 via steel wool-filled copper crucible (not shown) or a porous ceramic-filled copper crucible (not shown). The use of steel wool provides for uniform heating of the ETC material and increases the evaporation surface area. The use of steel wool also provides for a more controlled deposition rate of the ETC coating on a substrate.

Figure 1B:
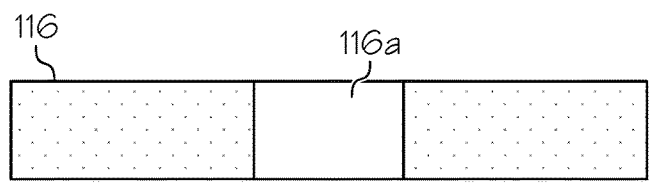
FIG. 1B schematically depicts an enlarged view of a glass plate 116 and illustrates the opening 116a for receiving a quartz monitor.

Still referring to FIG. 1A, the dome 110 is made of a light weight material that is magnetic or contains a magnetic material, for example and without limitation, aluminum containing iron or another suitable magnetic material. The dome 110 can be rotated either clockwise or counter-clockwise. At the top center of the dome is an opening 164 (depicted in FIG. 3B) and a transparent glass plate 116 is placed on the underside of the dome to cover the opening. The transparent glass plate 116 may include an opening 116a, as depicted in the enlarged view of the transparent glass plate 116 depicted in FIG. 1B. A quartz monitor 114 is received in and passes through the transparent glass plate 116. An optical fiber 112 is positioned above the transparent glass plate 116, as illustrated. The quartz monitor 114 controls the deposition rate of the optical materials by feedback to the e-beam power supply so that the deposition rate of the coating material is kept substantially constant. The optical fiber 112 is positioned above the transparent glass plate 116 to protect it from the deposition materials within the vacuum chamber 102. The optical fiber measures reflectance to determine when the deposition of each layer of the coating material should be stopped because it has reached the targeted design thickness.

Figure 1C:
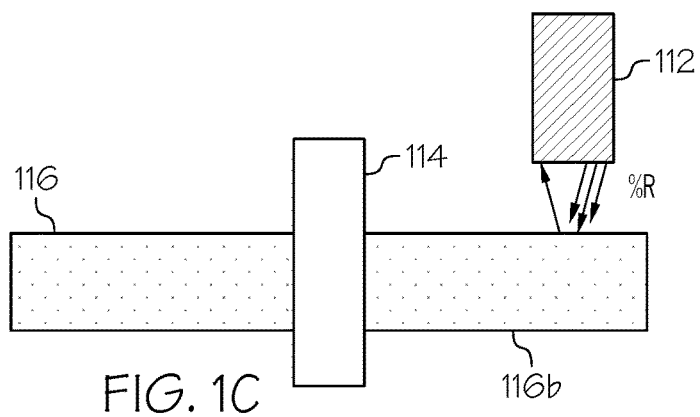
FIG. 1C schematically depicts an enlarged view of the glass plate with the quartz monitor received within the opening and an optical fiber, both of which are used to measure and control the deposition of the optical coating materials onto glass substrates attached to a substrate carrier.

FIG. 1C is an enlargement of the circled area of the transparent glass plate 116 of FIG. 1A showing the relative orientations of the optical fiber 112, the quartz monitor 114 and the transparent glass plate 116. The quartz monitor 114 is positioned in the middle of the transparent glass plate 116 and passes through the opening 116a. The optical fiber 112 is positioned to the side of the quartz monitor 114. Light transmitted from the optical fiber 112 passes through the transparent glass plate 116 and is reflected back as the surface of the transparent glass plate is coated. The arrows adjacent to % R schematically depict the reflectance of light from the surface 116b of the transparent glass plate as the transparent glass plate is being coated. The reflectance increases with the thickness of the coatings applied to surface 116b of the transparent glass plate. The light reflected from the surface 116b of the transparent glass plate is directed back to an optical sensor (not shown) coupled to a controller (not shown) of the e-beam source. The output of the optical sensor (which is indicative of the thickness of the applied optical coating and/or the ETC coating) is utilized by the controller to determine the deposited thickness of the coatings. As such, the reflected light can be used to control the deposited thickness of an individual layer, a coating period, and the entire optical coating, as well as the deposited thickness of the ETC coating.

The top of the dome 110 is attached to a vacuum shielded rotation shaft 117 indicated by the dashed parallel lines. The vacuum shielded rotation shaft 117 has a vacuum seal bearing 119 attached to the vacuum shielded rotation shaft for rotating the vacuum shielded rotation shaft 117 and dome 110. Accordingly, it should be understood that the vacuum shielded rotation shaft 117 is vacuum sealed to the top of the dome 110. The vacuum shielded rotation shaft 117 is driven by an external motor (not illustrated) located external to the vacuum chamber 102. In an embodiment, the dome 110 may be rotated at a rotation frequency in the range from about 20 rpm to about 120 rpm. In another embodiment, the rotation frequency is in the range from about 40 rpm to about 83 rpm.

FIG. 2 schematically depicts a segment 110a of dome 110. As shown in FIG. 2, a plurality of substrate carriers 130 are magnetically attached to the dome 110. The substrate carriers 130 are utilized to secure glass substrates for coating in the coating apparatus 100.

Figure 3A:
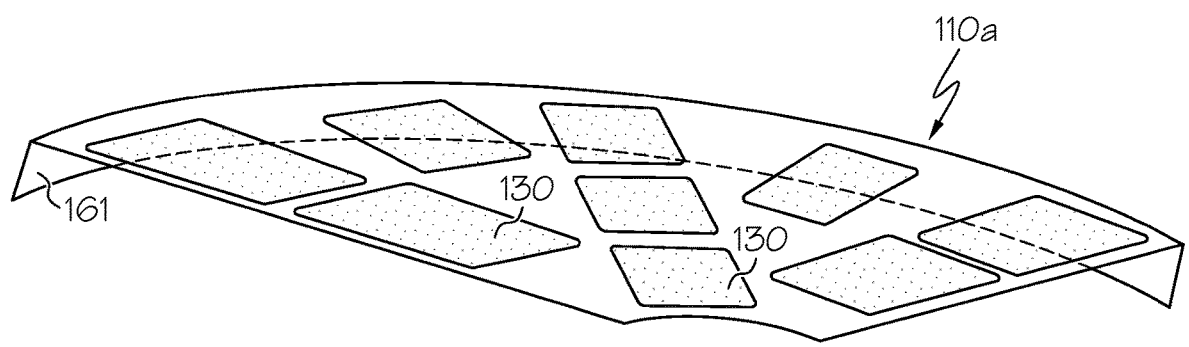
FIG. 3A schematically depicts an oblique bottom-up side view of a segment of the dome of the coating apparatus of FIG. 1A with a plurality of substrate carriers magnetically attached to the dome.
Figure 3B:
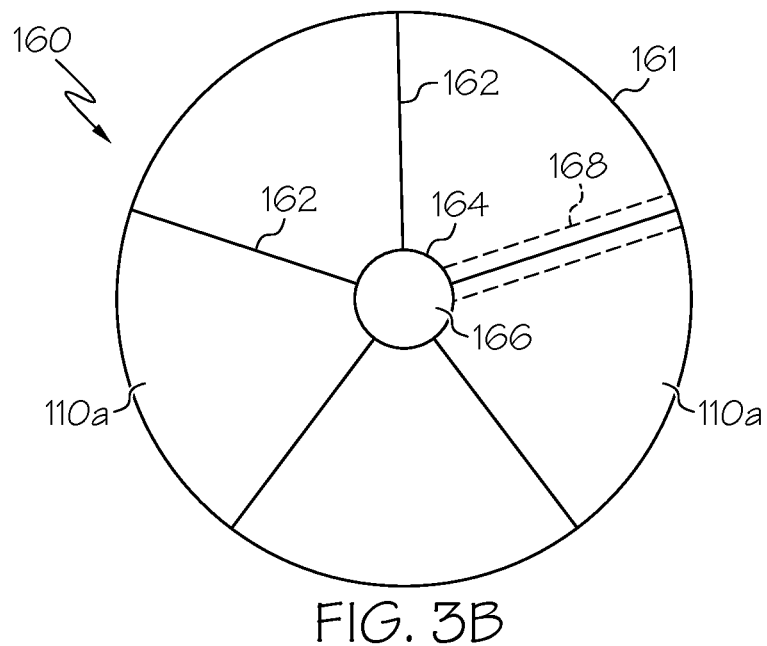
FIG. 3B schematically depicts a frame that supports the dome segments 110a, frame 160 having an outer lip/rim 161 as is also illustrated in FIG. 3A, an inner rim (not numbered) at opening 164 to which the rotation shaft 117 can be attached (not illustrated), and a plurality of spokes 162 that are sufficiently wide to accommodate the side edges of the dome segments as is illustrated at 168.

FIG. 3A is a drawing illustrating an oblique bottom-up side view of a segment 110a of the dome 110 showing the lip 161 with a plurality of substrate carriers 130 magnetically attached to the dome 110. FIG. 3B is an illustration of the frame 160 that is used to support a plurality of segments 110a. The frame 160 has an outer lip 161 (as depicted in FIG. 3A), an inner rim (not numbered) adjacent to opening 164 to which the vacuum shielded rotation shaft 117 can be attached (not illustrated), and a plurality of spokes 162 extending radially outward from the inner rim. The spokes 162 are sufficiently wide to accommodate the side edges of the dome segments as is illustrated at 168.

Figure 17A:
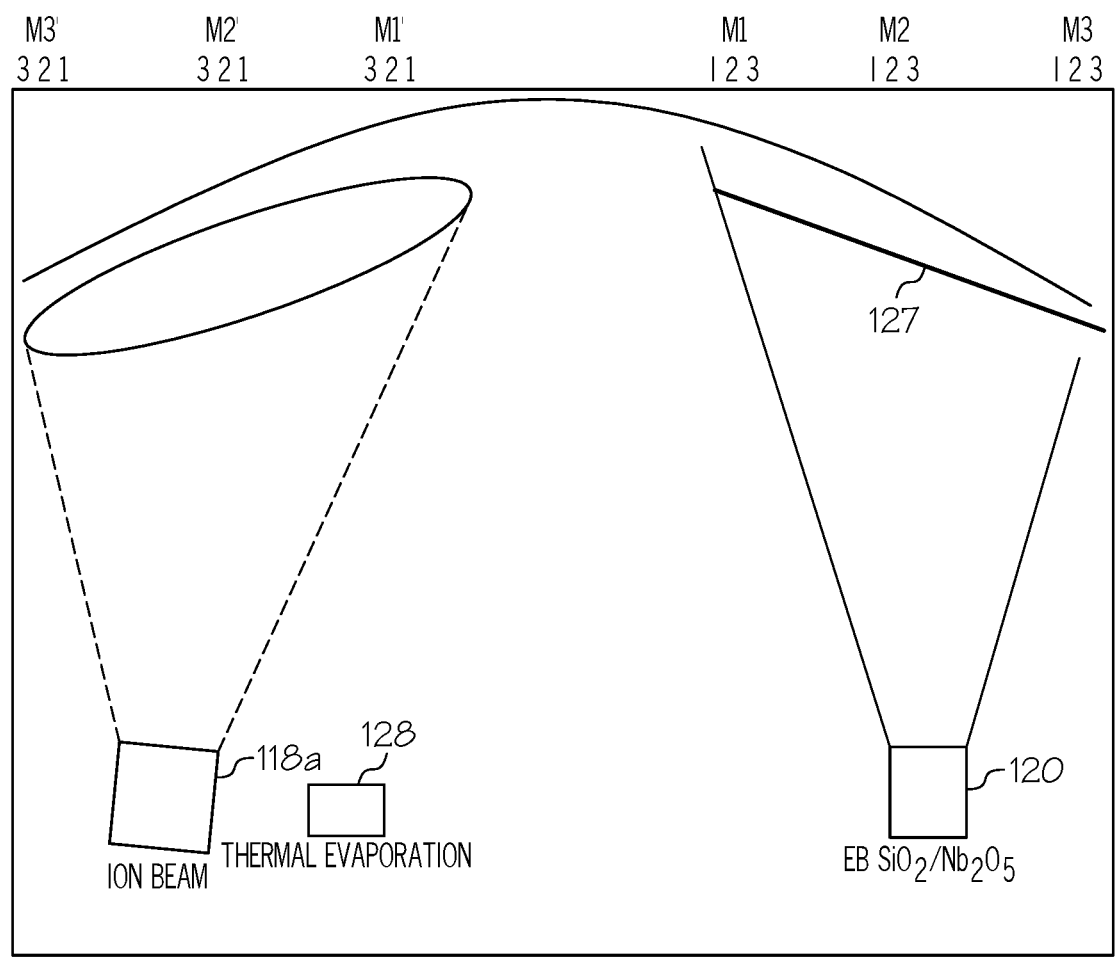
FIG. 17A is an illustration of an embodiment of the coating apparatus having a shadow mask covering a selected area of the dome to improve the uniformity of the optical coating.

FIG. 17A is a simplified illustration of an alternative embodiment of a coating apparatus for depositing an optical coating and an ETC coating on a substrate. In this embodiment, the coating apparatus includes a shadow mask 127 covering a selected area of the dome to improve the uniformity of the optical coating deposited on the substrate. The support for adjustably supporting the shadow mask 127 is not depicted in FIG. 17A. In the coating apparatus of FIG. 17A, the plasma source is an ion source 118a. Since the ion source 118a and the e-beam source 120 used to evaporate the optical coating materials are located on different sides of the vacuum chamber, the ion source is not shielded by the shadow mask, thereby improving the efficacy of the ion source 118a in hardening the deposited optical coating materials. The ion source is used to densify the optical coating material to near bulk density thereby increasing the hardness of the optical coating and improving the abrasion reliability/abrasion resistance of the optical coating.

Figure 21B:
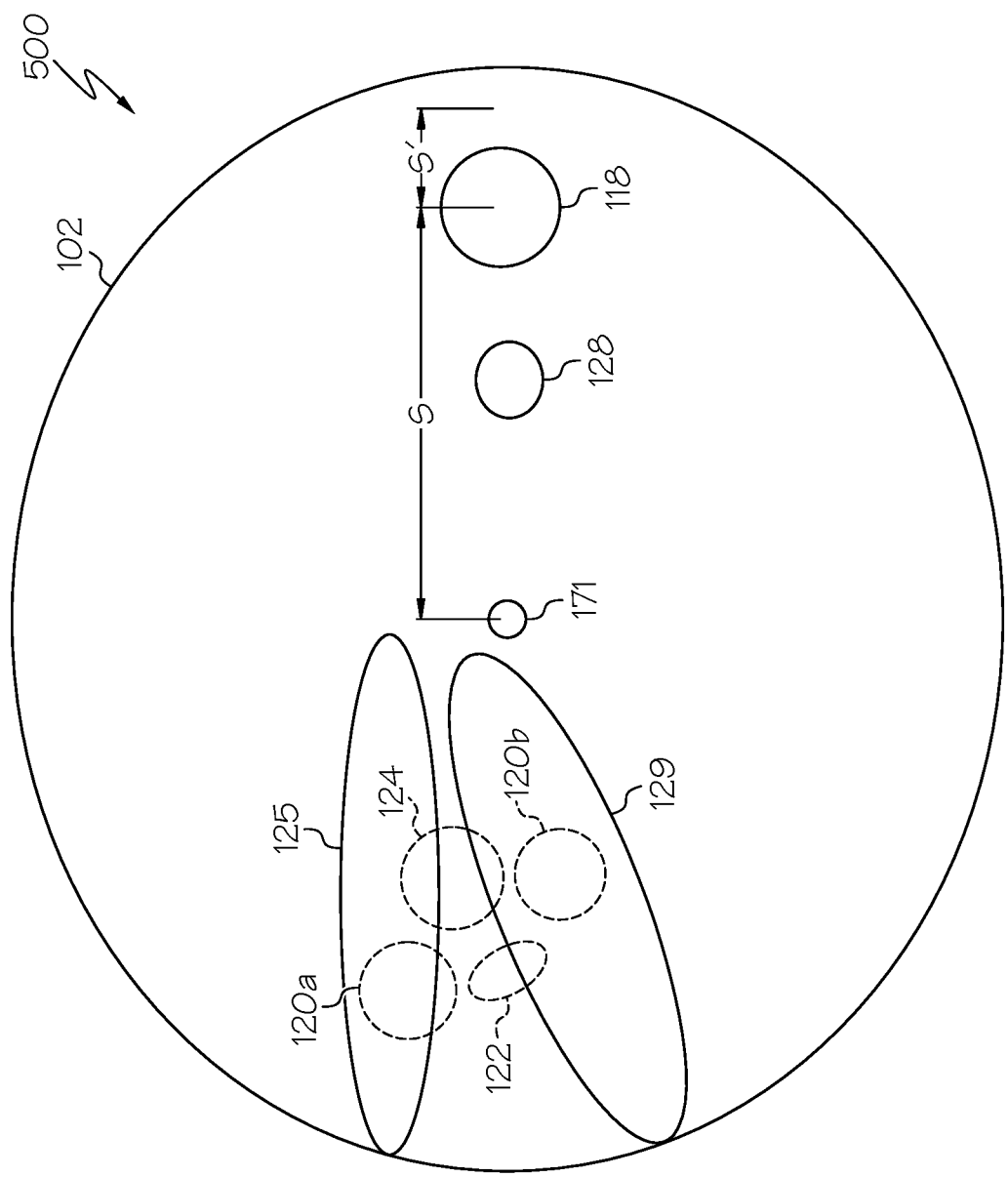
FIG. 21B schematically depicts a horizontal cross section of the coating apparatus of FIG. 21A.

FIG. 21A schematically depicts another alternative embodiment of a coating apparatus 500 for depositing an optical coating and an ETC coating on a substrate. A cross section of the coating apparatus 500 is schematically depicted in FIG. 21B. In this embodiment, the coating apparatus 500 includes a vacuum chamber 102 with a rotatable dome 110 comprising a magnetic material, as described with respect to FIG. 1. The rotating dome is coupled to a vacuum shielded rotation shaft 117 which is disposed in a vacuum seal bearing 119 to facilitate rotation of the dome in the vacuum chamber. The dome also includes a transparent glass plate 116 with a quartz monitor 114 and an optical fiber 112 which, collectively, are used to monitor and control the deposition rate of coatings applied to substrates attached to the dome, as described above with respect to FIGS. 1A-1C.

The coating apparatus 500 also includes an optical coating carrier 124 having a plurality of boats 126 which contain optical coating materials. The boats 126 are separate source containers used to contain the different materials used to deposit the optical coating layer on substrates affixed on the underside of the dome 110. The boats 126 contain different optical coating materials so that only one type of coating material (e.g., either a high refractive index, low refractive index, or medium refractive index material) is applied at a time. In this embodiment, the coating apparatus 500 includes a first e-beam source 120a, a second e-beam source 120b, and an e-beam reflector 122. The first e-beam source 120a, the second e-beam source 120b, and the e-beam reflector 122 are arranged such that electron beams emitted from the respective sources are directed onto the e-beam reflector 122 and redirected from the e-beam reflector 122 onto a single optical coating material contained in a boat 126 located on the optical coating carrier 124 to co-evaporate the optical coating material. It has been found that the use of multiple e-beam sources used to co-evaporate a single optical coating material enhances the thickness uniformity of the resultant coating deposited on a substrate. Additionally or alternatively, the first e-beam source 120a emits a first electron beam onto the e-beam reflector 122, such that the first electron beam is redirected to a first optical coating material contained in the boat 126, and the second e-beam source 120b emits a second electron beam onto the e-beam reflector 122, such that the second electron beam is redirected to a second optical coating material contained in a different boat 126. In one or more embodiments, the first optical coating material is different from the second optical coating material. In embodiments, the first optical coating material includes a high refractive index material and the second optical coating material includes a low or medium refractive index material. In embodiments, more than one reflector may be utilized such that one reflector (not shown) redirects the first electron beam and a second reflector (not shown) redirects the second electron beam.

In this embodiment, the coating apparatus 500 further comprises a first shadow mask 125, which is adjustably positionable in the vacuum chamber 102, and a second shadow mask 129, which has a fixed position within the vacuum chamber 102. The first shadow mask is adjustable between an extended position (depicted in FIG. 21A), wherein the first shadow mask 125 is positioned between at least one of the e-beam sources and the rotatable dome and a retracted position (not depicted), wherein the first shadow mask is not positioned between the rotatable dome and either e-beam source. Specifically, in embodiments, the first shadow mask 125 may comprise a first portion 180 which is coupled to an actuator 175, such as an electric motor or the like, which rotates the first shadow mask 125 from the extended position to the retracted position. In embodiments, the first shadow mask 125 may include a second portion 181 pivotally attached to the first portion 180. The second portion 181 may fold towards the first portion 180 as the first shadow mask is rotated to the retracted position (i.e., as the first shadow mask is rotated downward, in a clockwise direction, in FIG. 21A).

Figure 22:
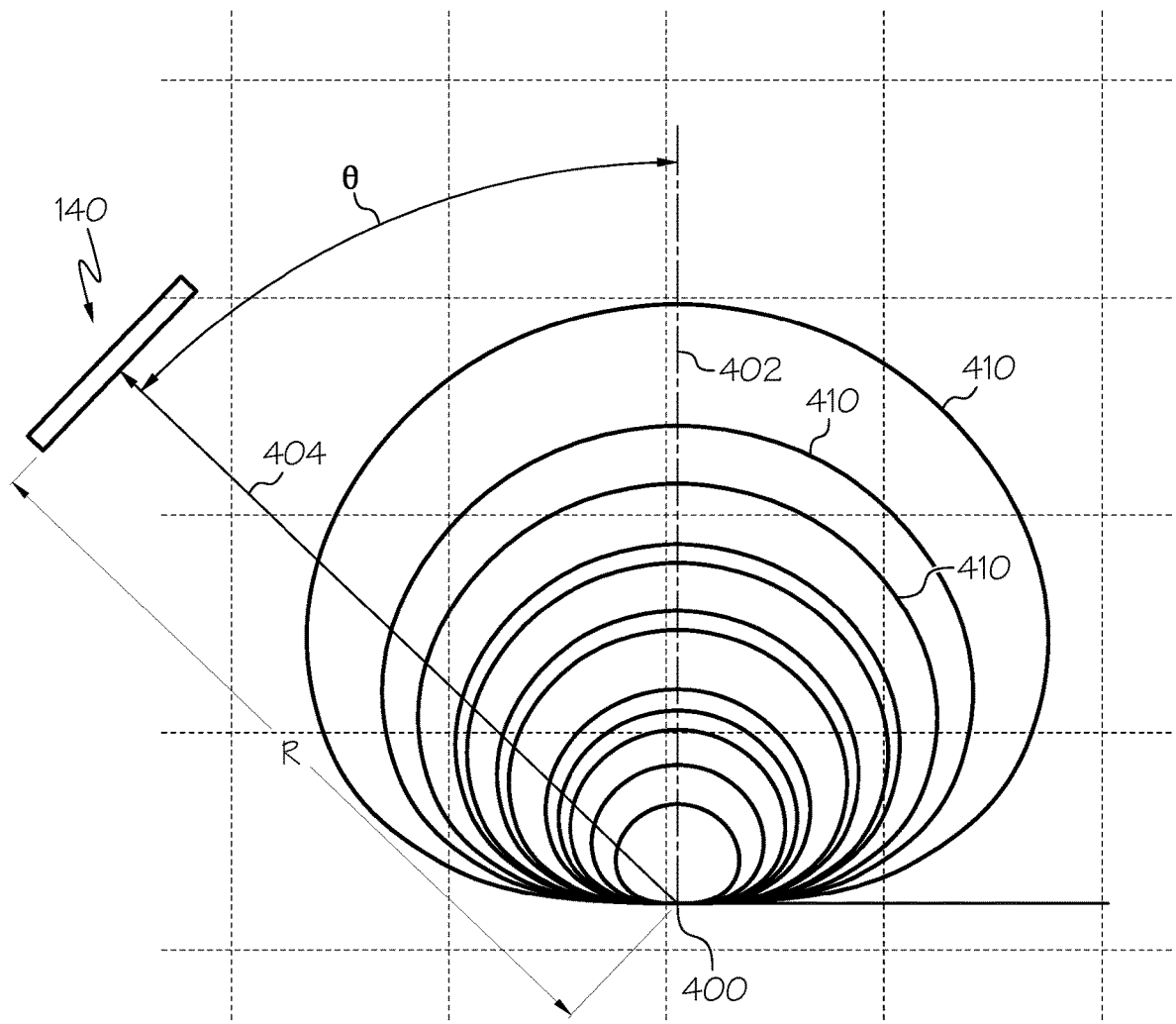
FIG. 22 graphically depicts variations in coating thickness as a function of the relative positioning of the coating source and the substrate being coated.

In the cross section of the coating apparatus 500 schematically depicted in FIG. 21B, the first shadow mask 125 is positioned between the e-beam source 120a and the underside of the dome 110 (not shown) when the first shadow mask 125 is in the extended position. The second shadow mask 129 is fixedly positioned between the e-beam source 120b and the underside of the dome 110 (not shown). The first shadow mask 125 can be extended or retracted depending on the type of optical coating materials being deposited. For example, when $Nb_2O_5$ is deposited, the first shadow mask 125 may be in a retracted position. However, when $SiO_2$ is deposited, the first shadow mask 125 may be in the extended position. The shadow masks are utilized to promote thickness uniformity in the deposited optical coating irrespective of the position of the substrate on the dome. Specifically, referring to FIG. 22, the deposited thickness of the coating materials evaporated from a point source 400 generally varies according to the relationship $Cos^n(\theta)/R^2$ where n is material and process parameter dependent, R is the distance between the evaporation source and the substrate 140 being coated, and $\theta$ is the angle between the vertical normal 402 to the point source and a normal 404 to the surface of the substrate 140 being coated, as schematically depicted in FIG. 22. Accordingly, the position of the plasma source, the position of the e-beam source, and the shape and diameter of the dome will each affect the thickness of the coating deposited on the substrate. The contour curves 410 depicted in FIG. 22 schematically depict the thickness of the material deposited for a given distance R from the point source 400. Each discrete location on a particular curve will have approximately the same thickness of deposited material. Given the potential for variations in the thickness of the deposited coating, the uniformity masks positioned on the interior of the vacuum chamber are appropriately shaped and positioned to provide uniform coating thicknesses for substrates positioned on different areas of the dome by providing a mask which intermittently obscures the substrates from the coating materials as the substrates are rotated in the vacuum chamber on the dome.

In addition, the coating apparatus 500 also includes at least one thermal evaporation source 128 for evaporating the ETC coating material to facilitate depositing the coating material onto substrates affixed on the underside of the dome 110. The at least one thermal evaporation source 128 is positioned in the vacuum chamber 102 below the dome 110. In embodiments, liquid ETC coating material is placed in a copper crucible filled with steel wool or a porous ceramic material. The crucible is heated by the thermal evaporation source 128 to evaporate the ETC coating material which, in turn, is deposited on substrates located on the underside of the rotatable dome 110.

The coating apparatus 500 also contains a plasma source, such as an ion-beam source. As described above with reference to FIG. 1A, the plasma source 118 is located in the vacuum chamber 102 below the dome 110 and is generally oriented to emit ions or plasma upwards, towards the underside of the dome 110 thereby densifying and/or hardening the optical coating applied to the substrates attached to the underside of the dome. In the embodiments described herein, the plasma source 118 is vertically oriented and positioned within the vacuum chamber 102 such that the plasma source 118 is located radially outward from an axis of rotation 171 of the rotatable dome 110, and the plasma emitted from the plasma source 118 is incident on the underside of the rotatable dome 110 from at least the center of the rotatable dome 110 to at least an outer edge 172 of the rotatable dome 110. For example, in embodiments, the plasma source 118 is positioned such that a distance S between the axis of rotation 171 of the rotatable dome 110 and the plasma source 118 is greater than a distance S' between the plasma source 118 and a projected perimeter 173 (i.e., the perimeter of the cylinder circumscribed by the rotation of the rotatable dome 110). Moreover, the path between the plasma source 118 and the underside of the dome 110 is unobstructed (such as by a shadow mask or the like) which increases the amount of plasma incident on the underside of the rotatable dome 110. Positioning the plasma source 118 in this manner decreases the average distance between the plasma source 118 and the underside of the rotatable dome 110 which, in turn, improves the amount of densification achieved in the coatings applied on the substrates attached to the underside of the rotatable dome 110. The increased density of the optical coating materials improves the abrasion resistance of the coating. In embodiments, the coating apparatus 500 may also include a neutralizer 121 positioned to project an electron cloud into the path of the plasma emitted from the plasma source 118. Specifically, the plasma emitted from the plasma source 118 may include charged ions (such as $Ar^{+1}$ ions, $O^{+1}$ ions, and/or $O^{+2}$ ions) which are accelerated towards the substrate by an anode. Once these charged ions reach the substrate, they may repel similarly charged ions thereby negating the effect of the plasma assisted deposition. To overcome this, the neutralizer 121 is used to direct an electron cloud into the path of the plasma emitted from the plasma source 118. The neutralizer 121 includes an electron emitter, such as a hot filament and/or high flux/high rate electron emission device. In some embodiments, the electron emitter may include a hollow cathode. The electron cloud emitted from the neutralizer interacts with the charged ions of the plasma, thereby neutralizing the charge (e.g., $Ar^{+1}$ ions→$Ar^0$, $O^{+1}$ ions→$O_2$, etc.

Figure 4A:
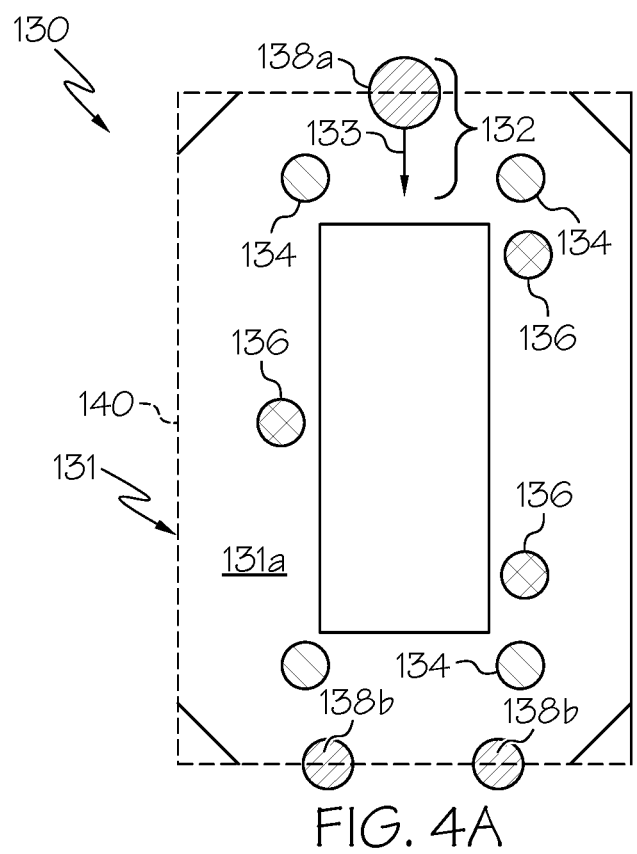
FIG. 4A schematically depicts a non-magnetic substrate carrier 130 having a plurality of elements 134 for magnetically attaching the carrier to dome 110 and for holding a glass substrate/article 140 during the coating process.
Figure 4B:
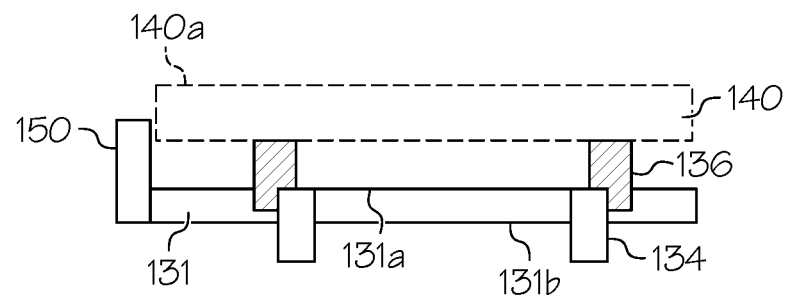

Referring now to FIGS. 4A and 4B, a substrate carrier 130 for carrying a single size substrate is schematically depicted. As illustrated in FIG. 4A, the substrate carrier 130 has a non-magnetic substrate carrier base 131, a retention surface 131a for releasably affixing a substrate to be coated, an underside 131b (see FIG. 4B) positioned opposite the retention surface 131a, and a plurality of magnets 134 for magnetically attaching the carrier to the dome 110 and for off-setting the substrate carrier 130 a distance from the dome 110. In one or more embodiments, a substrate may be releasably affixed to the retention surface 131a of the substrate carrier 130. Various mechanisms may be utilized to releasably affix the substrate carrier 130 to the retention surface 131a. In the embodiment depicted in FIGS. 4A and 4B, the substrate carrier 130 also includes a plurality of pins 136 for supporting a surface of a substrate 140 (illustrated in FIG. 4B) and a spring system 132. The spring system 132 generally includes a retractable pin 138a that is held in place by a spring 133 (schematically depicted as an arrow) that biases the retractable pin 138a in the direction indicated by the arrow, and a plurality of fixed pins 138b. Pins 138a and 138b are used to hold a substrate 140 (indicated by dashed line) in place on the substrate carrier 130 while the glass substrate is being coated. Specifically, when a substrate 140 is positioned on the retention surface 131a of the substrate carrier 130, a portion of an edge of the substrate abuts pins 138b and the spring system 132 is arranged to bias pin 138a into contact with an opposing edge of the substrate, thereby releasably retaining the substrate between the pins 138a, 138b. In one embodiment, pins 138a, 138b are arranged on the substrate carrier base 131 such that no portion of the pin extends above the surface of the substrate, thereby promoting coating thickness uniformity across the coated surface of the glass substrate. In another embodiment (discussed further herein with respect to FIG. 5), the pins 138a, 138b are constructed and arranged on the substrate carrier base 131 to minimize variations in the thickness of coatings applied to the substrate. FIG. 4B is a side view of FIG. 4A illustrating a substrate 140 supported on pins 136 that extend into the non-magnetic substrate carrier base 131 for a distance from the retention surface 131a, a plurality of magnets 134 that extend from below the retention surface 131a of the substrate carrier 130 and through the substrate for a distance beyond the underside 131b, a side stopper 150 extending from the non-magnetic substrate carrier base 131 to a distance from a top surface 140a of the substrate 140 releasably affixed on the retention surface 131a. The side stopper 150 orients the glass substrate on the non-magnetic substrate carrier base 131 without affecting the application of the coatings, thereby preventing "shadows" on the surface of the glass substrate. Specifically, the top surface 140a of the glass substrate is the surface that will be coated with the optical coating and the easy-to-clean coating. The side stoppers 150 are sized such that the side stoppers do not extend above the top surface 140a of the substrate 140 releasably affixed on the retention surface 131a. For a glass substrate having a thickness of 5 mm, the top of side stopper 150 will be in the range of 2-3 mm below the top surface 140a of the substrate 140. The opening (not numbered) in the middle of the substrate carrier reduces the weight of the carrier.

Figure 4C:
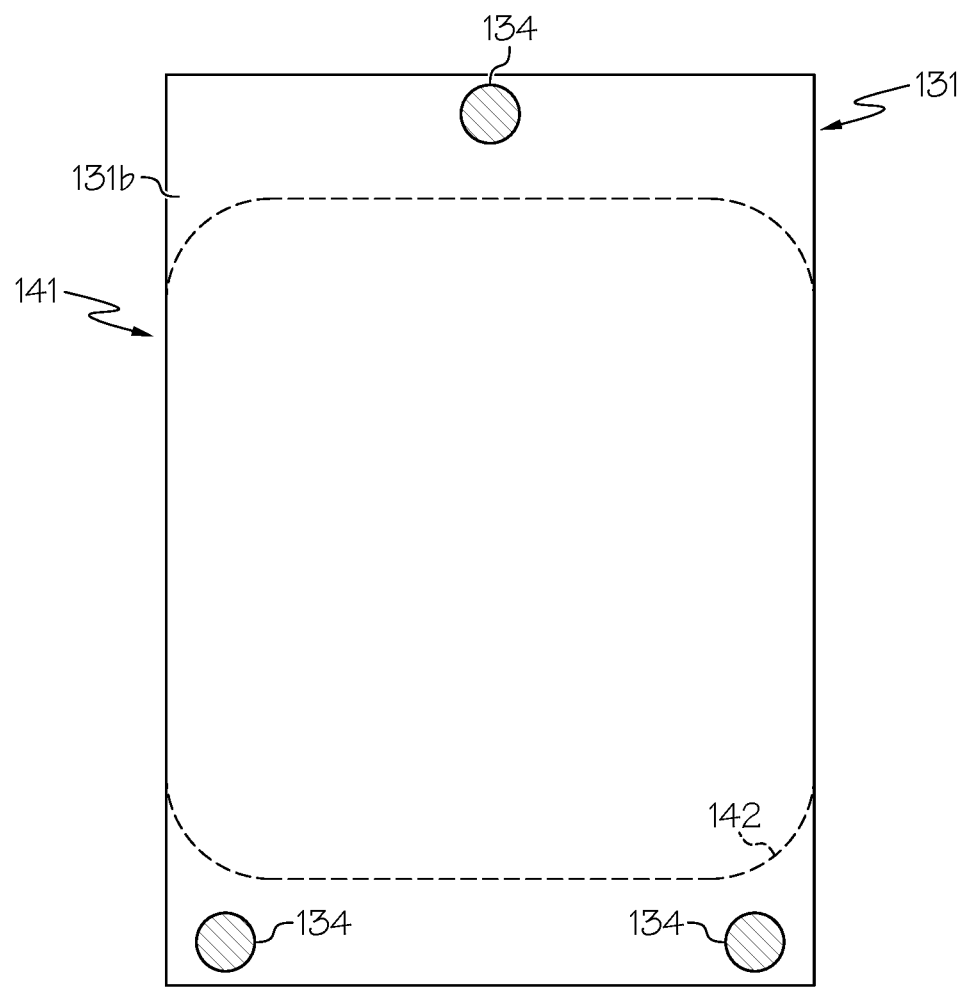
FIG. 4C is a bottom view of a substrate carrier base 131 depicting magnets 134 positioned outside of a perimeter 142 of the substrate retention area 141.

While FIGS. 4A and 4B show one particular arrangement of the magnets 134 in the substrate carrier base 131, it should be understood that other arrangements are contemplated. For example, in embodiments, the magnets 134 may be arranged in the substrate carrier base 131 to minimize the affect the magnetic field of the magnets 134 has on the coating process, such as repelling ions and/or particulate matter deposited on the substrate. Referring to FIG. 4C, the substrate carrier base 131 has a substrate retention area 141 (schematically depicted in dashed lines) on the substrate retention surface opposite the underside 131b. The area of the substrate retention area 141 is less than the area of the substrate retention surface, and the magnets 134 are positioned on the underside 131b of the substrate carrier base 131 outside of a perimeter 142 of the substrate retention area 141. Locating the magnets 134 outside of the perimeter 142 of the substrate retention area 141 mitigates the effect the magnetic field of each magnet 134 has on the coating process. In the embodiments described herein, the magnets 134 may be appropriately sized to accommodate the size and weight of the substrate(s) retained on the substrate retention surface. For example, larger magnets may be used in conjunction with substrate carrier bases sized to hold larger substrates whereas smaller magnets may be used in conjunction with substrate carrier bases sized to hold smaller substrates.

Figure 15:
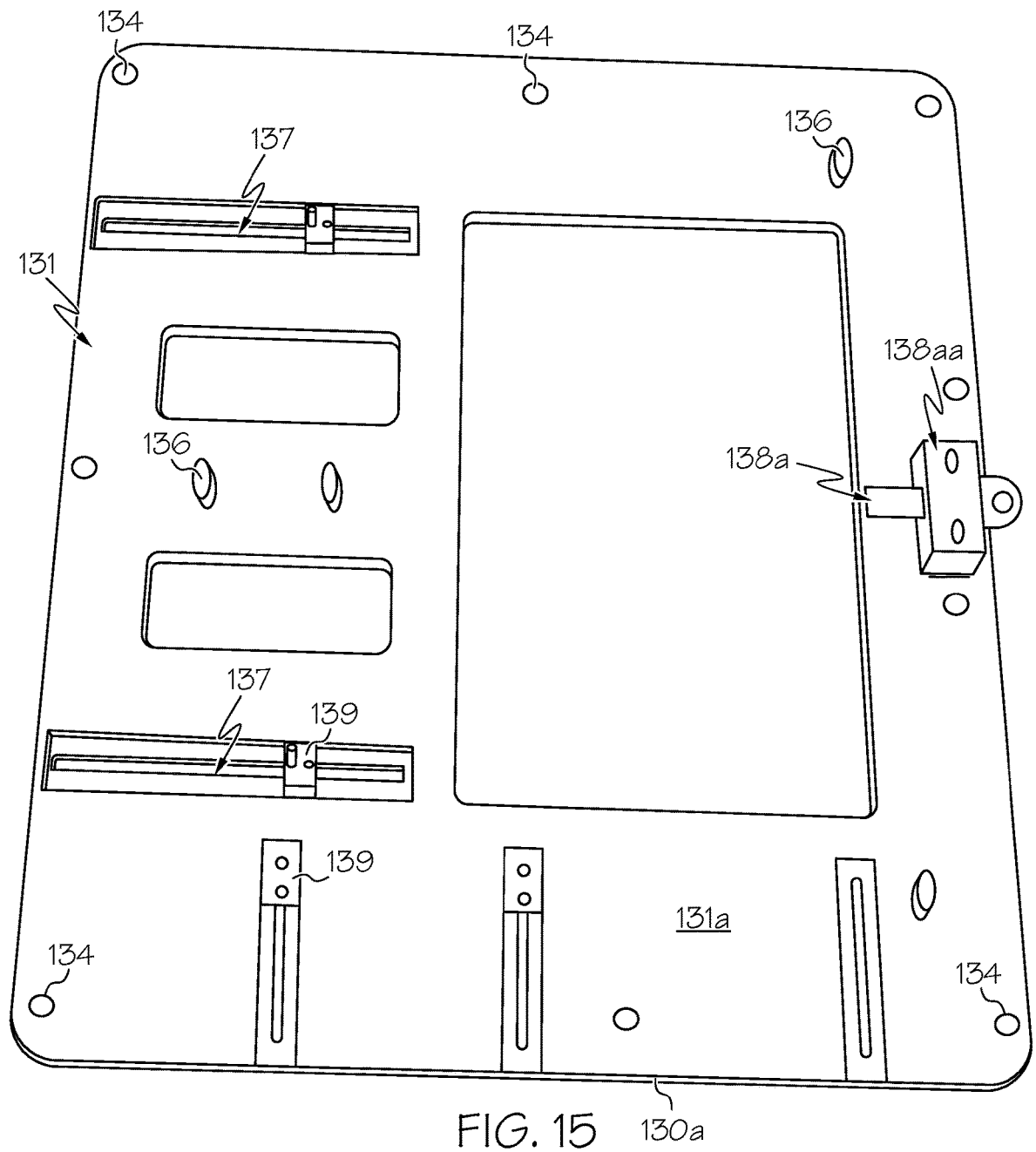
FIG. 15 illustrates an adjustable magnetic carrier 130a that is substantially similar to the carrier 130 illustrated in FIG. 4A and enables the use of a single carrier for different size substrates.

Referring now to FIG. 15, an adjustable substrate carrier 130a, similar to the fixed substrate carrier 130 illustrated in FIG. 4A, is depicted. The adjustable substrate carrier 130a has a non-magnetic substrate carrier base 131 which includes a plurality of magnets 134 for attaching the adjustable substrate carrier to the dome of the coating apparatus as described above. The adjustable substrate carrier 130a also includes one or more mechanisms or adhesion aids for releasably affixing one or more substrates to the substrate carrier 130a or, more specifically, to the retention surface 131a of the substrate carrier. In the embodiment shown in FIG. 15, the mechanism or adhesion aid includes a plurality of pins 136 extending from the retention surface 131a of the substrate carrier for supporting a surface of a glass substrate releasably affixed on the adjustable substrate carrier 130a. The mechanism or adhesion aid may include a housing 138aa that is positioned proximate an edge of the adjustable substrate carrier 130a and houses a retractable pin 138a (depicted partially extended from the housing). The housing 138aa includes a spring (not shown) positioned in the housing 138aa. The spring bias the retractable pin 138a outward from the housing 138aa. The adjustable substrate carrier 130a may optionally include side stoppers 150a (not illustrated in FIG. 15) for orienting a glass substrate on the adjustable substrate carrier 130a. In the embodiment depicted in FIG. 15, the adjustable substrate carrier 130a further includes a plurality of moveable pins 139 for holding an edge of the glass substrate. The moveable pins 139 are positioned in tracks 137 to facilitate adjustably positioning the moveable pins 139 relative to the adjustable substrate carrier 130a. The moveable pins 139, in combination with the retractable pin 138a, enable the use of a single carrier for different size substrates. The substrate or substrates may be held by the pins and any optional side stoppers 150a in the same manner as described above with respect to FIGS. 4A and 4B so that a shadow free coating is formed on the substrate. In addition, the magnets 134 may be positioned outside of the perimeter of the substrate retention area, as described above with respect to FIG. 4C.

Figure 20A:
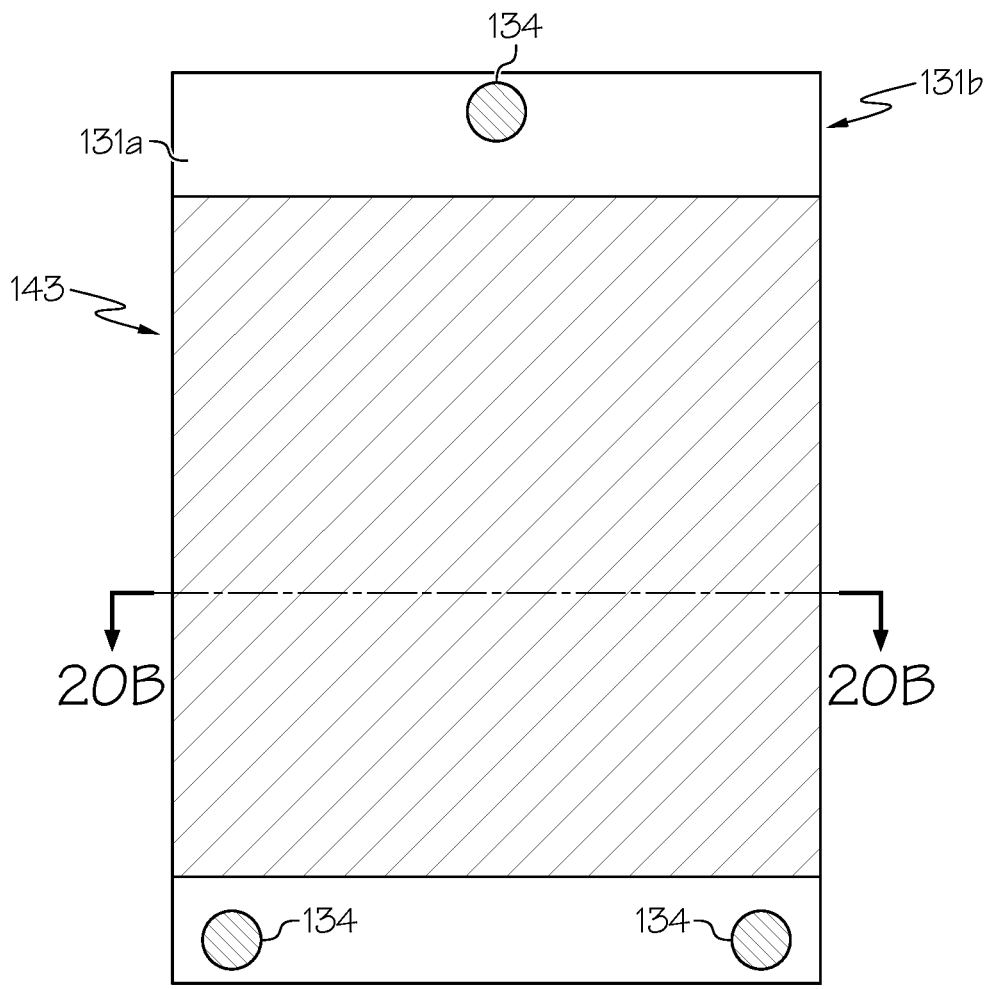
FIG. 20A schematically depicts a retention surface 131a of a substrate carrier having a layer of adhesive material 143 disposed thereon.

Referring now to FIG. 20A, another embodiment of a substrate carrier 130b is schematically depicted. In this embodiment, the substrate carrier 130b utilizes a layer of adhesive material 143 disposed on the retention surface 131a in the substrate retention area to releasably receive substrates to be coated. Use of an adhesive obviates the need for mechanical fasteners which may cause variations in the thickness of the applied coating. The adhesive material 143 generally comprises a pressure sensitive contact adhesive. Suitable materials may include, without limitation, acrylic adhesives, rubber adhesives, silicone adhesives, and/or similar pressure sensitive adhesives. Alternatively, the substrates may be held to the retention surface 131*a* using a static charge, such as when a statically charged film is positioned on the retention surface 131*a* and acts as an adhesive material. These materials permit the substrate to be firmly attached to the substrate carrier 130*b*, and specifically to the retention surface 131*a*, during coating but also permit the substrate to be readily removed from the substrate carrier 130*b* after coating is complete. The magnets 134 may be positioned outside of the perimeter of the substrate retention area, as described above with respect to FIG. 4C. Further, use of a layer of adhesive material 143 on the retention surfaces enables one size of substrate carrier to be used for substrates of different sizes and/or shapes and also allows for multiple substrates to be attached to a single substrate carrier.

Figure 20B:
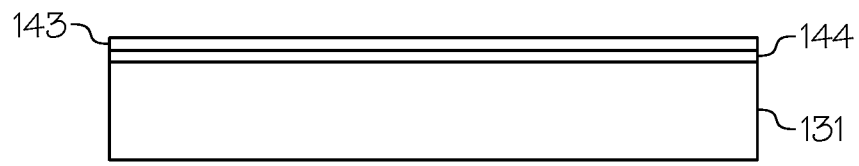
FIG. 20B schematically depicts a cross section of a substrate carrier with a polymer film 144 and adhesive layer 143 positioned on the substrate carrier base.

Referring now to the cross section of the substrate carrier 130*b* depicted in FIG. 20B, in embodiments, the adhesive material 143 is positioned on a polymer film 144 which, in turn, is adhered to the retention surface 131*a* of the substrate carrier base 131. In embodiments, the polymer film may be a thermoplastic polymer film, such as a polyethylene film or a polyester polymer film.

In some embodiments, the polymer film 144 may be capable of being statically charged. In these embodiments, a separate adhesive material 143 is not needed as the statically charged film acts as the adhesive for releasably retaining the substrates on the retention surface 131*a*. Suitable static films include, without limitation, Visqueen film manufactured by British Polyethylene Industries Limited.

Figure 16A:
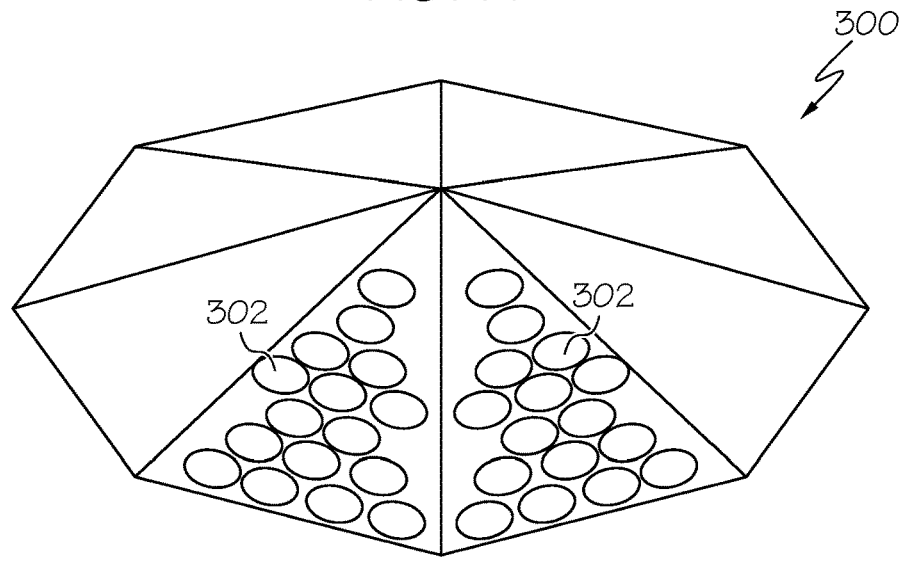
FIG. 16A illustrates a prior art dome carrier 300 having a plurality of openings 302 for placements of the lenses that are to be coated.
Figure 16B:
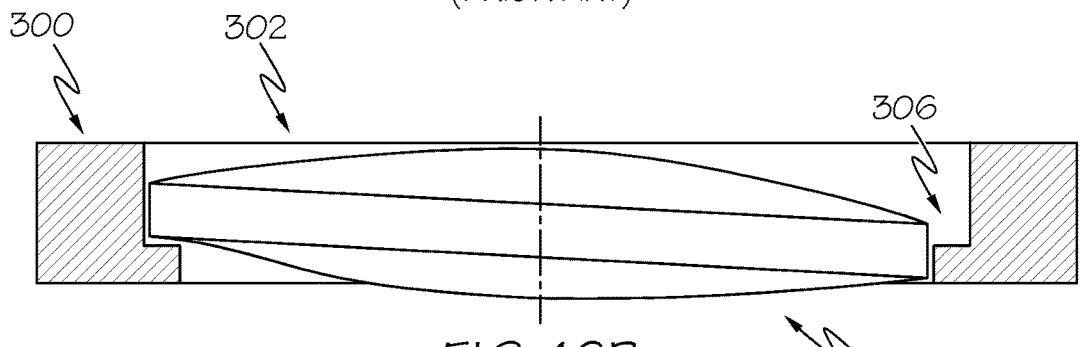
FIG. 16B illustrates a lens 304 that has slipped off a shoulder 306 of the one carrier 300 inside opening 302, the lens 304 being in a position to be broken as the carrier 300 cools.

The substrate carriers 130, 130*a*, 130*b* have non-magnetic substrate carrier bases 131 and a plurality of magnets 134 for holding the carriers to the dome 110 and for off-setting the carrier a distance from the dome 110. The use of these magnetic carriers is an improvement over dome carriers that are used in the coating of optical elements, such as lenses. For example, FIG. 16A illustrates a conventional dome carrier 300 having a plurality of openings 302 for positioning lenses that are to be coated. When the lenses are coated they are inserted into an opening 302 in the carrier 300. However, in this conventional design, it is difficult to uniformly coat both the inside and outside of the dome. It is also difficult to keep the coating material away from surfaces of the lenses that are not to be coated. In addition, the part being coated can move with respect to the opening in the dome as the dome heats up, resulting in breakage as the dome cools after coating. For example, FIG. 16B illustrates a lens 304 that has slipped off one support shoulder 306 inside an opening 302 of the dome carrier. As is easily seen, if the carrier cools faster than the lens 304, the contraction of the carrier can cause the lens to break. In the present application, since the substrate carrier is off-set a distance from the dome by the magnets that hold the carrier to the dome, heat transfer is minimized and breakage does not occur as the dome cools. In addition, only one side of the glass article being coated is subjected to the coating materials due to the proximity of the carrier/substrate combination to the interior surface of the dome. As a result, the difficulties mentioned above in conventional dome carriers can be avoided.

Figure 5:
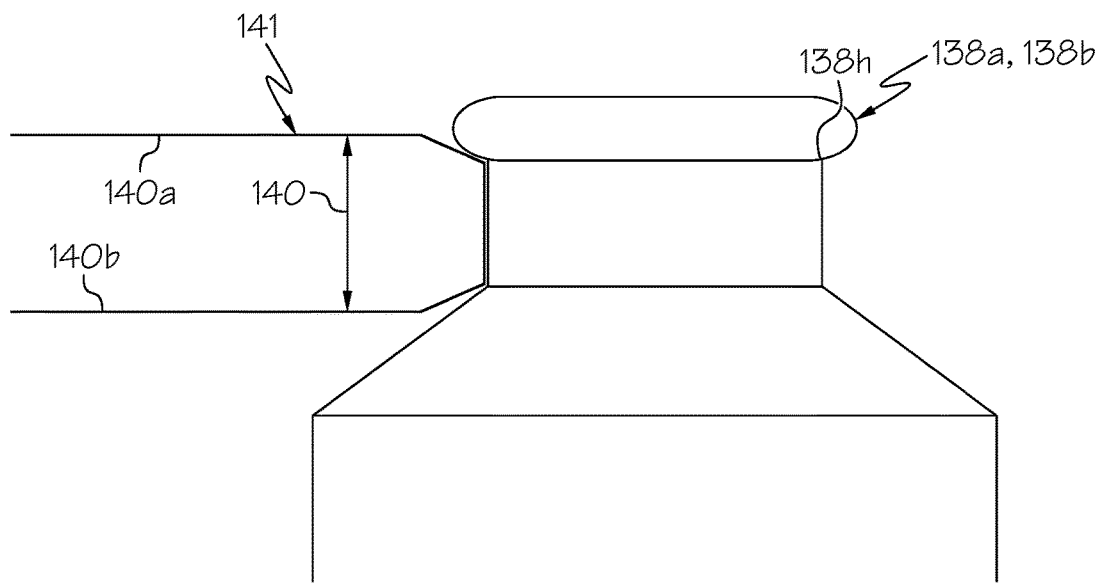
FIG. 5 schematically depicts one of the pins 138a and 138b against which a glass substrate 140 is held by the force exerted against it by a spring loaded adjustable pin 138a, and a shaped edge 141 that is in contact with the pin, in this case, a chamfered edge.

Referring now to FIG. 5, a cross section of one embodiment of the pins 138*a*, 138*b*, against which a glass substrate is held by the force exerted against it by the retractable pin 138*a*, is schematically depicted. These pins may be utilized in the substrate carriers schematically depicted in FIGS. 4A and 15. Specifically, the glass substrate has a shaped edge which fits between the head 138*h* of pins 138*a* and 138*b* and the remainder of the body of the pin. The edge of the glass substrate may be chamfered as illustrated at 141, rounded, bull nosed or otherwise contoured. When the substrate 140 is engaged with the pins 138*a*, 138*b*, the top 140*a* of the glass substrate is 2-3 mm below the top of the pin 138*a* or 138*b*. In this figure, reference numeral 140*b* indicates the bottom surface of the substrate 140.

Figure 6:
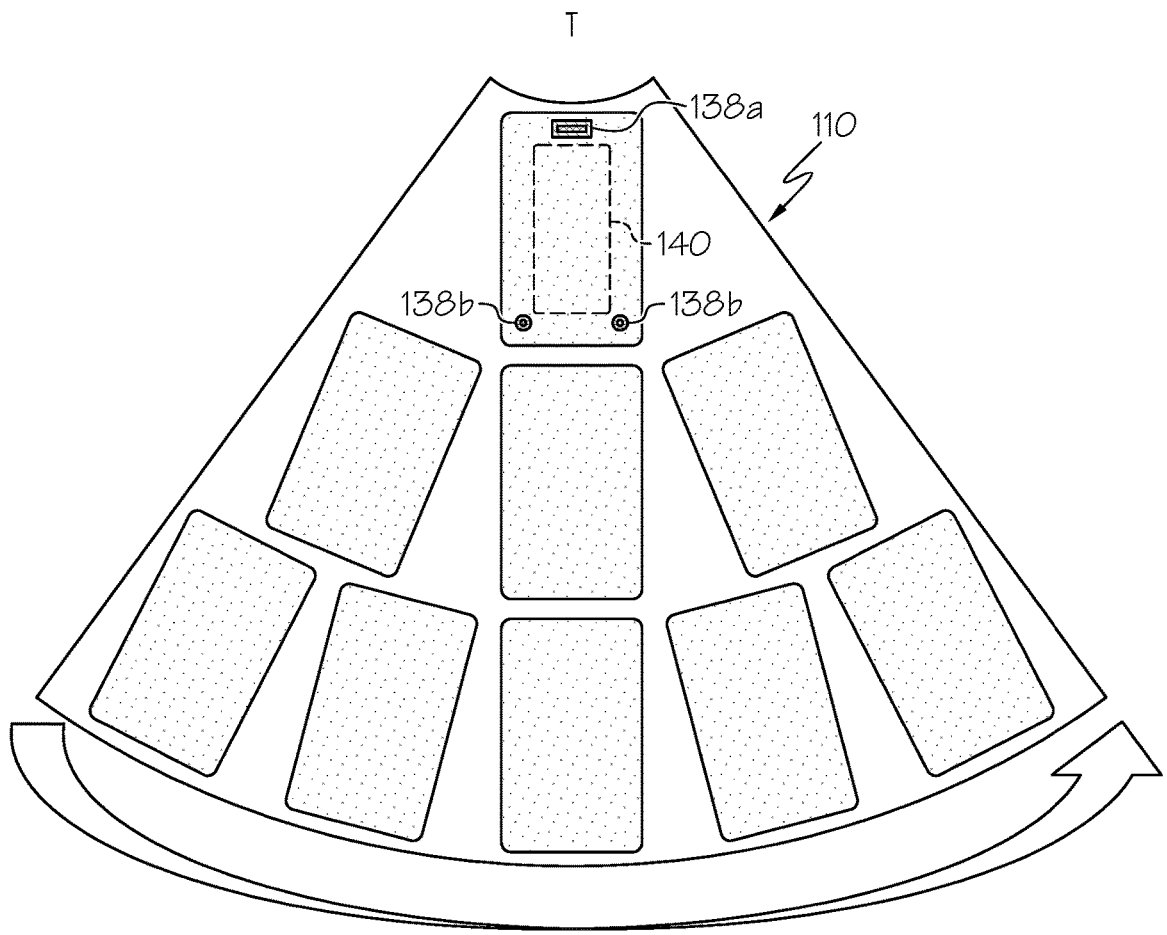
FIG. 6 illustrates substrate carriers 130 attached to dome 110 such that the retractable pin 138A is positioned perpendicular to the rotation direction, that is, closer to the opening at the top T of the dome 110 than the pins 138b also illustrated in FIG. 6.

Referring now to FIG. 4A and FIG. 6, a substrate 140 is loaded onto the substrate carrier 130, and the combination of the substrate 140 and the substrate carrier 130 is magnetically attached to the underside of dome 110. When the substrate carrier 130 with substrate 140 (dashed line) is loaded onto the dome 110 for coating, the retractable pin 138*a* is positioned perpendicular to the rotation direction of the dome 110 as indicated by the arrow, that is, the retractable pin 138*a* is closer to the opening at the top T of the dome 110 than the fixed pins 138*b*. When the substrate carrier 130 is so positioned the optical coating is uniformly deposited over the entire surface of the glass substrate 140 to form a "shadowless" or "shadow free" coated substrate 140. These terms, "shadowless" and "shadow free," refer to the fact that if:

(1) the retractable pin 138*a* is not positioned on dome 110 as described and illustrated in FIG. 6, and
(2) the top surface 140*a* of glass substrate 140 is less than 1 mm below head 138*h* of pin 138*a*, and
(3) the top of side stoppers 150 are not lower than the top surface 140*a*;

then the deposition of the optical coating will be non-uniform in the areas where these elements and other elements holding the substrate 140 are located. As a result, the optical coating will be thinner near these elements and thicker as one moves away from them. The result is a non-uniform optical deposition or "shadow" that can be noticed by a user of the articles. Such shadows can be avoided using the apparatus and methods described in this disclosure. Such shadows can also be avoided utilizing the substrate carriers 130 which do not include any elements which project beyond the top surface 140*a* of the substrate 140 positioned on the carrier 130, such as the substrate carriers 130 which utilize a layer of adhesive material to releasably affix the substrates 140 to the substrate retention surface as depicted in FIG. 20A.

Referring again to FIG. 1A, once the adjustable substrate carrier 130*a* is magnetically attached to the dome 110, the materials for applying the optical coating to the glass substrate 140 are loaded into separate boats 126 (i.e., separate source containers) of the optical coating carrier 124. As noted hereinabove, the optical coating is composed of alternating layers of high and low refractive index materials or alternating layers of high and middle refractive index materials. Exemplary high index materials having an index of refraction greater than or equal to 1.7 and less than or equal to 3.0 are: $ZrO_2$, $HfO_2$, $Ta_2O_5$, $Nb_2O_5$, $TiO_2$, $Y_2O_3$, $Si_3N_4$, $SrTiO_3$, and $WO_3$; an exemplary medium index material having an index of refraction greater than or equal to 1.5 and less than 1.7 is $Al_2O_3$; and an exemplary low index materials having an index of refraction greater than or equal to 1.3 and less than or equal to 1.6) are: $SiO_2$, $MgF_2$, $YF_3$, $YbF_3$. In some embodiments, medium refractive index material may be used to form the low refractive index layer L. Accordingly, in some embodiments, the low index material may be selected from $SiO_2$, $MgF_2$, $YF_3$, $YbF_3$ and $Al_2O_3$. In an exemplary embodiment, the optical coating materials are oxide coatings in which the high index coating is a lanthanide series oxide, such as La, Nb, Y, Gd or other lanthanide metals, and the low index coating is $SiO_2$. In addition, the material for applying the easy-to-clean (ETC) coating is loaded into the at least one thermal evaporation source 128. As noted hereinabove, the ETC materials may be, for example, fluorinated silanes, typically alkyl perfluorocarbon silanes having the formula $(R_F)_xSiX_{4-x}$, where $R_f$ is a linear $C_6$-$C_{30}$ alkyl perfluorocarbon, X=Cl or —$OCH_3$— and x=2 or 3. The fluorocarbons have a carbon chain length in the range of greater than or equal to 3 nm and less than or equal to 50 nm.

Once the coating materials are loaded, the vacuum chamber 102 is sealed and evacuated to a pressure less than or equal to $10^{-4}$ Torr. The dome 110 is then rotated in the vacuum chamber 102 by rotating the vacuum shielded rotation shaft 117. The plasma source 118 is then activated to direct ions and/or plasma towards the glass substrates 140 positioned on the underside of the dome 110 to densify the optical coating materials as they are applied to the glass substrate 140. Thereafter, the optical coating and ETC coating are sequentially applied to the glass substrate 140. The optical coating is first applied by vaporizing the optical materials positioned in the boats 126 of the optical coating carrier 124. Specifically, the e-beam source 120 is energized and emits a stream of electrons which are directed onto the boats 126 of the optical coating carrier 124 by the e-beam reflector 122. The vaporized material is deposited on the surfaces of the glass substrates 140 as the glass substrates 140 are rotated with the dome 110. The rotation of the dome 110, in conjunction with the shadow mask 125 and the orientation of the glass substrates 140 on the substrate carriers 130, allows the optical coating materials to be uniformly coated onto the glass substrate carriers, thereby avoiding "shadows" on the coated surface of the glass substrate 140. As described hereinabove, the e-beam source 120 is utilized to sequentially deposit layers of high refractive index material and low refractive index material or medium refractive index material to achieve an optical coating having the desired optical properties. The quartz monitor 114 and the optical fiber 112 are utilized to monitor the thicknesses of the deposited materials and thereby control the deposition of the optical coating, as described herein.

Once the optical coating has been applied to the glass substrate 140 to the desired thickness using the desired coating material(s), optical coating ceases and the ETC coating is applied over the optical coating by thermal evaporation as the glass substrate 140 rotates with the dome 110. Specifically, the ETC material positioned in the at least one thermal evaporation source 128 is heated, thereby vaporizing the ETC material in the vacuum chamber 102. The vaporized ETC material is deposited on the glass substrate 140 by condensation. The rotation of the dome 110, in conjunction with the orientation of the glass substrates 140 on the substrate carriers 130, facilitates uniformly coating the ETC materials onto the glass substrate 140. The quartz monitor 114 and the optical fiber 112 are utilized to monitor the thicknesses of the deposited materials and thereby control the deposition of the ETC coating, as described herein.

Figure 7A:
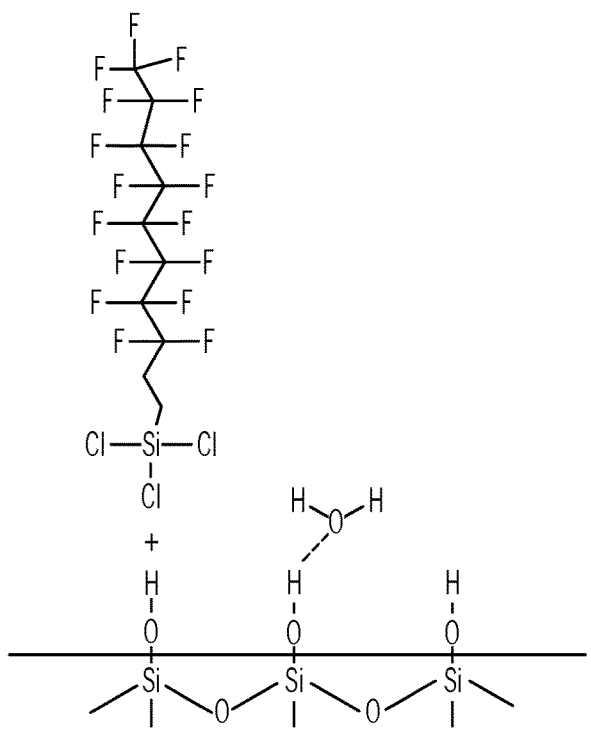
FIGS. 7 A-C are schematic representations of the fluorinated silane grafting reaction with glass or an oxide AR coating.
Figure 7B:
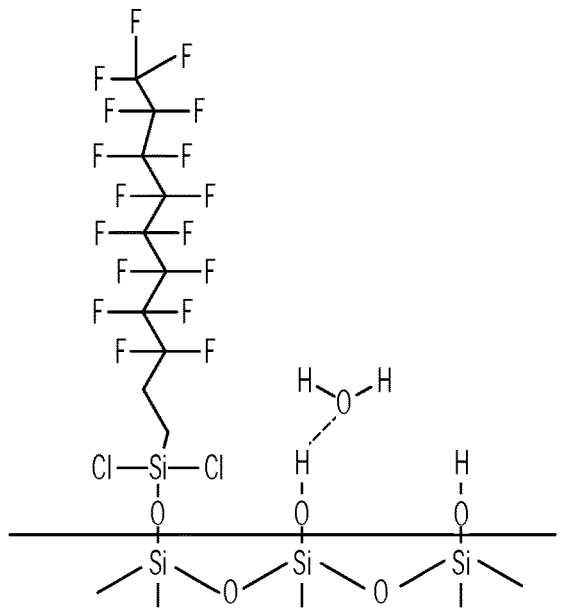
Figure 7C:
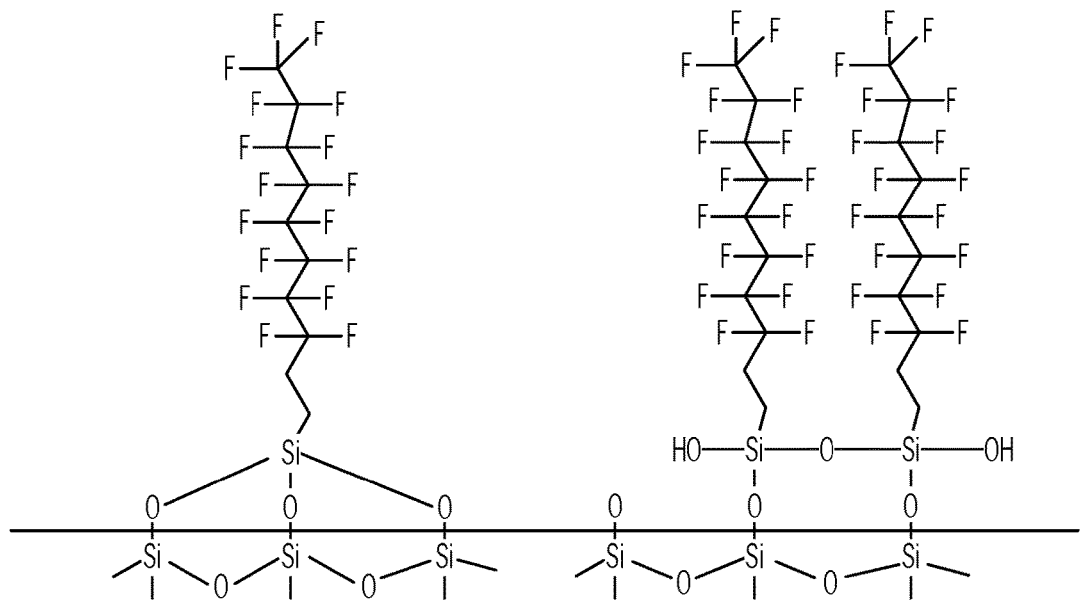

FIGS. 7A-7C are a schematic representation of the fluorinated silane grafting reactions with glass or an oxide optical coating (i.e., the reaction between the ETC coating material and the glass or an oxide optical coating). FIG. 7C illustrates that, when fluorocarbon trichlorosilane is grafted to the glass, the silane silicon atom can be either (1) triply bonded (three Si—O bonds) to the glass substrate or the surface of a multilayer oxide coating on the substrate or (2) doubly bonded to a glass substrate and have one Si—O—Si bond to an adjacent $R_F$-Si moiety. The ETC coating process time is very short and can be used to provide an ETC coating having a thickness in a range from greater than or equal to 3 nm and less than or equal to 50 nm over the freshly applied optical coating without breaking vacuum (i.e., without exposing the optical coating to ambient atmosphere). In the coating process described herein, the ETC material is evaporated from a single source. However, it should be understood that the ETC material may also be simultaneously evaporated from a plurality of sources. For example, it has been found that 2-5 separate ETC material sources may be advantageous. Specifically, the use of a plurality of sources containing the ETC material results in a more uniform ETC coating and can enhance coating durability. The term "sources", as used herein, refers to the containers or crucibles from which the ETC material is thermally evaporated.

Figure 8:
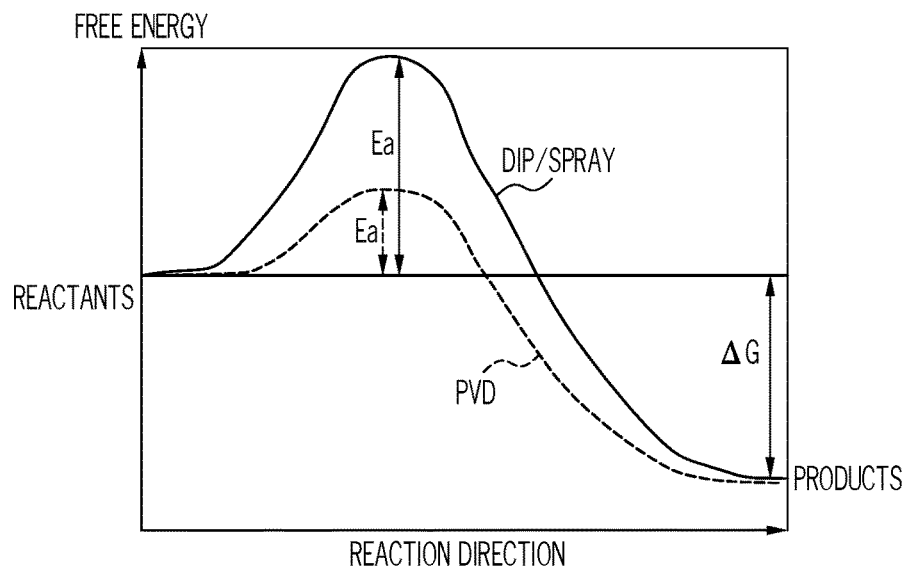
FIG. 8 illustrates the AR optical coating layers that would underlie the ETC coating to provide a barrier to isolate glass surface chemistry and contamination, and further to provide a lower activation energy site for fluorinated silanes to chemically bond to the AR optical coating with maximum coating density, as well as crosslinking over the coated surface in order to maximize abrasion reliability (durability)

In the embodiments described herein, an $SiO_2$ layer is generally applied as a capping layer for optical coatings. The $SiO_2$ layer is generally deposited as part of the optical coating prior to the deposition of the ETC coating. This $SiO_2$ layer provides a dense surface for grafting and crosslinking of silicon atoms of the ETC coating as these layers were deposited at high vacuum ($10^{-4}$-$10^{-6}$ Torr) without the presence of free OH. Free OH, for example a thin layer of water on the glass or AR surface, is detrimental during ETC material deposition, because the OH prevents the silicon atoms in the ETC material from bonding with the oxygen atoms of metal oxide or silicon oxide surfaces, that is, the optical coating surface. When the vacuum in the deposition apparatus is broken, that is, the apparatus is opened to the atmosphere, air from the environment, which contains water vapor, is admitted, and the silicon atoms of the ETC coating react with the optical coating surface to create at least one chemical bonds between the ETC silicon atom and surface oxygen atom and release alcohol or acid once exposed to air. Since the ETC coating material typically contains 1-2 fluorinated groups and 2-3 reactive groups, such as $CH_3O$— groups, the ETC coating is capable of bonding to 2-3 oxygen atoms at the optical coating surface, or crosslinking with another coating molecule, as shown in FIG. 7C, to create a strongly bonded ETC coating. The PVD deposited $SiO_2$ surface is pristine and has a reactive surface. For example, for a PVD deposited $SiO_2$ cap layer, the binding reaction has a much lower activation energy, as is illustrated in FIG. 8, than on a glass that has a complicated surface chemistry, has an environmental contaminant on it, or has a water layer on the glass surface.

Thus, once the ETC coating has been applied over the optical coating, the glass substrate 140 with the optical coating and the ETC coating is removed from the chamber and allowed to cure in air. If allowed to cure simply by sitting at room temperature (approximately 18-25° C., Relative Humidity (RH) 40%), the curing will take 1-3 days. Elevated temperatures may be utilized to expedite curing. For example, in one embodiment, the ETC coated article may be heated to a temperature of 80-100° C. for a time period from about 10 minutes to about 30 minutes at a RH in the range of greater than 50% and less than 100%. Typically, the relative humidity is in the range of 50-85%.

Once the ETC coating has been cured, the surface of the coating is wiped with a soft brush or an isopropyl alcohol wipe to remove any ETC material that has not bonded to the optical coating.

The methods and apparatuses described herein may be used to produced coated glass articles, such as coated glass substrates, which have both an optical coating (such as an AR coating or a similar optically functional coating) and an ETC coating positioned over the optical coating. Utilizing the methods and apparatuses described herein, the coated glass articles are generally shadow free across the optically coated surface of the glass article. In embodiments, the optical coating applied to the glass article may have a plurality of periods consisting of a layer of high refractive index material H having an index of refraction greater than or equal to 1.7 and less than or equal to 3.0, and a layer of low refractive index material L having an index of refraction greater than or equal to 1.3 and less than or equal to 1.6. The layer of high refractive index material may be the first layer of each period, and the layer of low refractive index material L may be the second layer of each period. Alternatively, the layer of low refractive index material may be the first layer of each period, and the layer of high refractive index material H may be the second layer of each period. In some embodiments, the number of coating periods in the optical coating may be greater than or equal to 2 and less than or equal to 1000. The optical coating may further include a capping layer of $SiO_2$. The capping layer may be applied on over one or a plurality of periods and may have a thickness in the range of greater than or equal to 20 nm and less than or equal to 200 nm. In the embodiments described herein, the optical coating may have a thickness in the range from greater than or equal to 100 nm to less than or equal to 2000 nm. However, greater thicknesses are possible depending on the intended use of the coated article. For example, in some embodiments, the optical coating thickness can be in the range of 100 nm to 2000 nm. In some other embodiments, the optical coating thickness can be in the range of 400 nm to 1200 nm or even in the range from 400 nm to 1500 nm.

The thickness of each of the layers of high refractive index material and low refractive index material may be in a range from greater than or equal to 5 nm and less than or equal to 200 nm. The thickness of each of the layers of high refractive index material and low refractive index material may be in a range from greater than or equal to 5 nm and less than or equal to 100 nm. As will be described further herein, the coated glass articles exhibit an improved resistance to abrasion from the specific coating methods and techniques utilized herein. The degradation of the coatings applied to the glass article may be assessed by the water contact angle following exposure of the glass coating to abrasion testing. The abrasion testing was carried out by rubbing grade 0000# steel wool across the coated surface of the glass substrate under a 10 kg normal load. The abraded area is 10 mm×10 mm. The frequency of abrasion is 60 Hz, and the travel distance of the steel wool is 50 mm. The abrasion testing is performed at a relative humidity RH<40%. In the embodiments described herein, glass articles have a water contact angle of at least 75° after 6,000 abrasion cycles. In some embodiments, the glass articles have a water contact angle of at least 105° after 6,000 abrasion cycles. In still other embodiments, the glass articles have a water contact angle of greater than 90° after 10,600 abrasion cycles.

The resistance of the glass article to abrasion and degradation may also be assessed by the length of scratches present on the glass article following abrasion testing. In embodiments described herein, the coated glass articles have a surface scratch length of less than 2 mm following 8000 abrasion cycles.

Moreover, the resistance of the glass article to abrasion and degradation may also be assessed by the change in the reflectance and/or transmittance of the glass article following abrasion testing, as will be described in more detail herein. In some embodiments, a % Reflectance of the glass article after at least 8,000 abrasion/wiping cycles is substantially the same as the % Reflectance of an unabraded/unwiped glass article. In some embodiments, the % Transmission of the glass article after at least 8,000 abrasion/wiping cycles is substantially the same as the % Transmission of an unabraded/unwiped glass article.

The deposition methods described herein may be used to produce a shadow free optical coating. This means that the optical coating is uniformly deposited over the entire coated surface of the glass substrate. In embodiments of the coated glass substrates described herein, the variation in a thickness of the optical coating from a first edge of the optical coating to second edge of the optical coating of the glass substrate is less than 4%. For example, in some embodiments, the variation in the thickness of the optical coating from a first edge of the optical coating to second edge of the optical coating of the glass substrate is less than or equal to 3%. In some other embodiments the variation in the thickness of the optical coating from a first edge of the optical coating to second edge of the optical coating of the glass substrate is less than or equal to 2%. In still other embodiments, the variation in the thickness of the optical coating from a first edge of the optical coating to second edge of the optical coating of the glass substrate is less than or equal to 1%.

The coating apparatus 500, the substrate carrier 130 and/or the methods described herein may be utilized to form other coatings on glass substrates or other substrates (e.g., plastic substrates). Such other coatings may include optical decorative coatings or protective coatings, which may include, without limitation, non-absorbing and absorbing materials. Exemplary decorative coating can be formed by either transparent dielectrics or absorbing materials. Such materials include metals (e.g., Cr, Ag, Au, W, Ti and the like), semiconductors (e.g., Si, AlN, TCO materials, such as ITO and $SnO_x$, Ge and the like), and absorbing materials ($SiN_x$, $SiO_xN_y$, TiN, $AlSiO_x$, and the like).

Ion-assisted electron-beam deposition provides a unique advantage for coating small and medium size glass substrates, for example, those having facial dimensions in the range of approximately 40 mm×60 mm to approximately 180 mm×320 mm, depending on the chamber size. Ion-assisted coating process provides a freshly deposited optical coating on the glass surface that has low surface activation energy with regard to the subsequent application of the ETC coating since there is no surface contamination (water or other environmental) that might impact the ETC coating performance and reliability. The application of the ETC coating directly after completion of the optical coating improves crosslinking between two fluorocarbon functional groups, improves wear resistance, and improves contact angle performance (higher oleophobic and hydrophobic contact angles) following thousands of abrasion cycles applied to the coating. In addition, ion-assisted e-beam coating greatly reduces coating cycle time to enhance coater utilization and throughput. Further, no post deposition heat treatment or UV curing of the ETC coating is required due to lower activation energy of the optical coating surface which makes the process compatible with post ETC processes in which heating is not permitted. Using the Ion-assisted e-beam PVD processes described herein, the ETC material can be coated on selected regions to avoid contamination to other locations of the substrate.

Example 1

A 4-layer $SiO_2/Nb_2O_5/SiO_2/Nb_2O_5$/substrate AR optical coating was deposited on sixty (60) pieces of Gorilla™ Glass (commercially available from Corning Incorporated) with dimensions (Length, Width, Thickness) of approximately 115 mm L×60 mm W×0.7 mm T. The coating was deposited using the methods described herein. The AR coating had a thickness of approximately 600 nm. After deposition of the AR coating, an ETC coating was applied on top of the AR coating by thermal evaporation using perfluoroalkyl trichlorosilanes having a carbon chain length in the range of 5 nm to 20 nm (Optool™ fluoro coating, Daikin Industries was used as an exemplary species). The deposition of the AR and ETC coatings was carried out in a single chamber coating apparatus as illustrated in FIG. 1A. After the AR coating was deposited, the AR coating source material was shut off, and the ETC material was thermally evaporated and deposited on the AR coated glass. The coating process was 73 minutes including parts loading/unloading. Subsequently, after the ETC coating was cured, water contact angles were determined after the surface was abraded using various abrasion cycles as indicated in Table 1. The abrasion testing was conducted with #0 steel wool and a 1 kg weight load. The data in Table 1 indicates that the sample has very good wear and hydrophobic properties. The coating order and layer thickness for a 6-layer $Nb_2O_5/SiO_2$ coating on a glass substrate is given in Table 2.

TABLE 1

Water contact angle abrasion test results

| Sample | Before Abrasion | 3.5K Abrasion | 4.5K Abrasion | 5.5K Abrasion |
|---|---|---|---|---|
| 1 | 113.8  114.2  116.1 | 109.9  107.2  108.5 | 92.6  103.4  96.3 | 69.5  85.5  70.5 |

TABLE 2

| Layer Number | Material | Thickness Range, nm |
|---|---|---|
| 6 | $SiO_2$ | 80-120 |
| 5 | $Nb_2O_5$ | 75-90 |
| 4 | $SiO_2$ | 5-20 |
| 3 | $Nb_2O_5$ | 40-80 |
| 2 | $SiO_2$ | 24-40 |
| 1 | $Nb_2O_5$ | 10-20 |
| Substrate | Glass | NA |

Example 2

Figure 9:
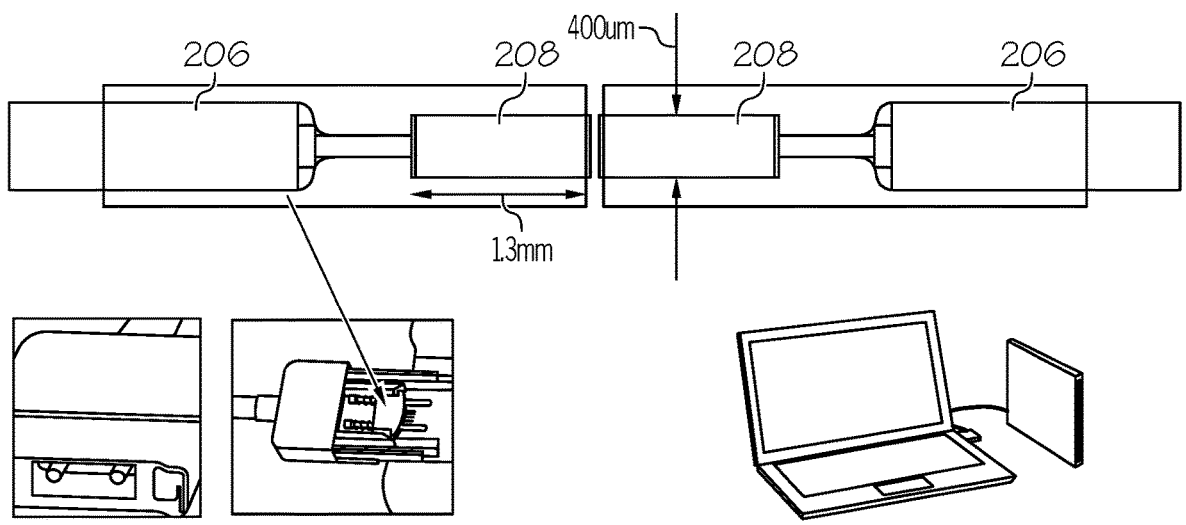
FIG. 9 is an illustration of AR-ETC coated GRIN lenses 208 for use with optical fibers 206 and some of their uses.

In this Example, the same fluoro-coating used in Example 1 was coated on a GRIN-lens for optical connectors, as is illustrated in FIG. 9, for use on optical fibers 206 used in laptop computers. Numeral 200 and the arrow point to a selective region of the GRIN lenses 208 for placing an ETC coating on top of an 850 nm AR coating to provide particle and wear resistance. Numeral 202 illustrates connecting an optical fiber to a laptop or tablet device, and numeral 204 illustrates the use of a coated fiber optic to connect a laptop to a media dock.

Figure 10:
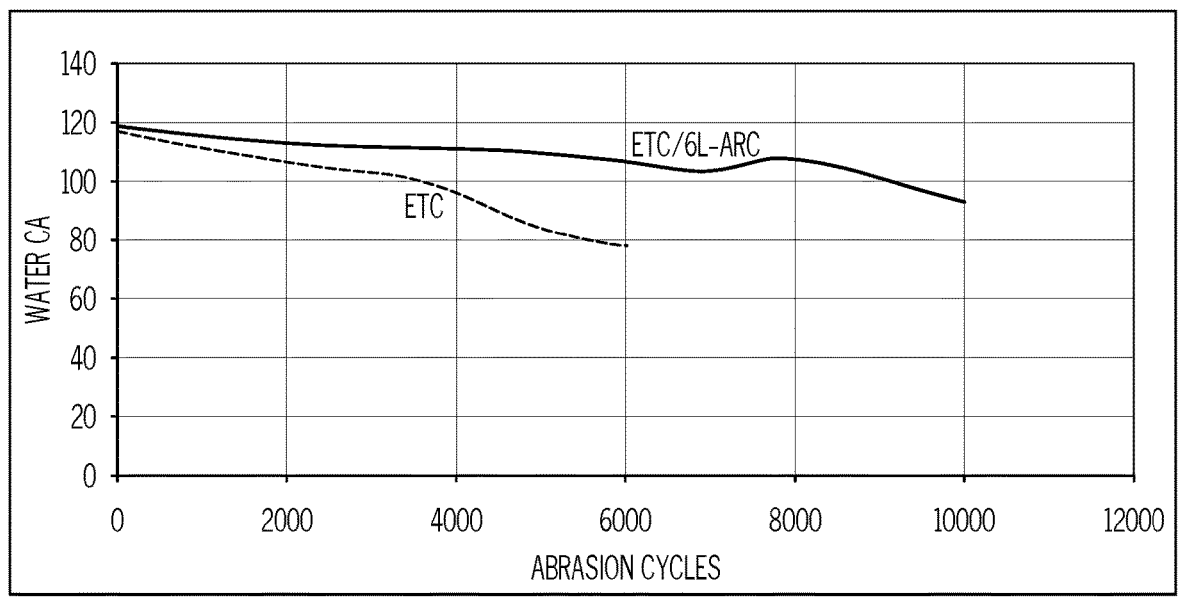
FIG. 10 is a comparison of abrasion testing data for a glass article having a PVD 8-10 nm ETC on 6 layer ARC ($Nb_2O_5/SiO_2$) coating and a glass article having only a spray coated ETC coating.

FIG. 10 is abrasion testing data on a glass article having an 8-10 nm thermally deposited on an ETC coating on a 6 layer AR coating consisting of substrate/(Nb2O5/SiO2)3, ETC/6L-AR coating, versus a glass sample with only the spray coated ETC coating. The glass was 0.7 mm thick Corning code 2319 glass which is commercially available, chemically tempered (ion-exchanged) glass. The abrasion testing was carried out under the following conditions: grade 0000# steel wool, 10 kg load on 10 mm×10 mm area, 60 Hz, 50 mm travel distance, and RH<40%. A water contact angle greater than 75 degrees is the criterion for judging coating failure. It was found that glass having an AR coating without the ETC coating was scratch damaged after only 10-20 wiping cycles. FIG. 10 shows that both glass samples start out with a water contact angle of 120°, and, after 6000 abrasion cycles, the glass sample with only the ETC coating had a water contact angle of 80°, whereas the glass sample made as described herein, ETC/6 layer-AR coating, had a water contact angle of at least 105°. After 10,000 abrasion cycles, the water contact angle of the ETC/6 layer-AR coating coated article was greater than 90°. The test clearly indicates that a glass article having an ETC coating deposited on top of an AR coating has a much greater degree of scratch resistance than a glass article have only an ETC coating applied to the glass.

Figure 11:
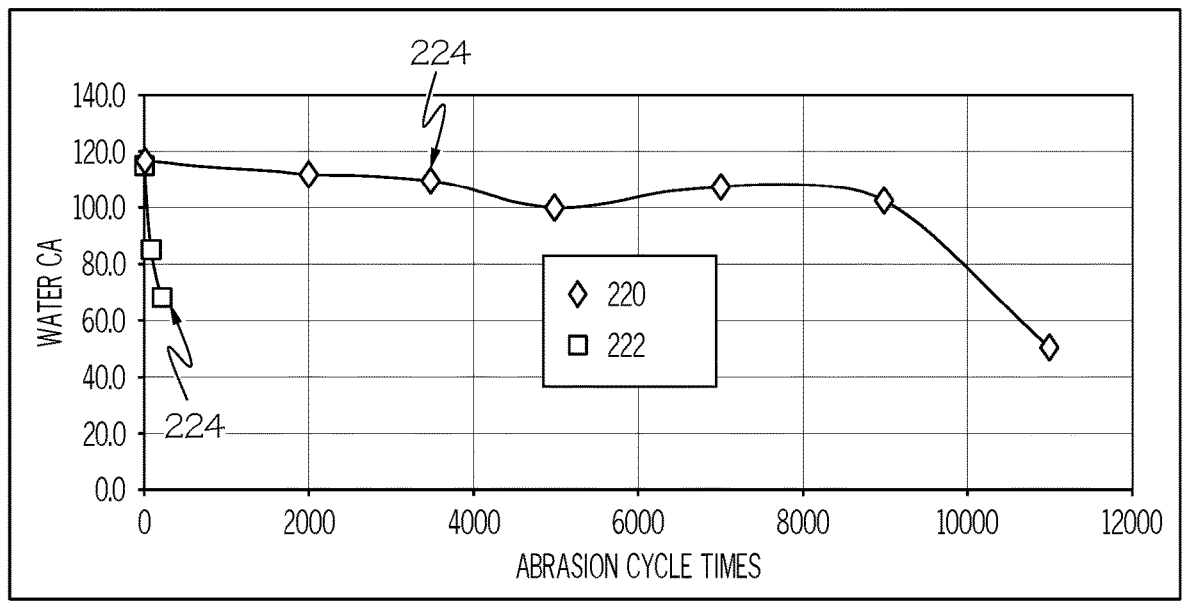
FIG. 11 is a comparison of the abrasion reliability of a glass article having a 6 layer PVD IAD-EB AR coating and an 8-10 nm thermal deposited ETC coating on top of the AR coating relative to a glass article having a PVD AR coating deposited in a first conventional coater and an ETC deposited in a second conventional coater.

FIG. 11 is a comparison of the abrasion durability of a (1) a glass article with a 6 layer PVD IAD-EB AR coating and an 8-10 nm thermally deposited ETC coating on top of the AR coating (indicated by numeral 220 and the diamond data marker), versus a commercially available glass article (indicated by numeral 222 and the square data marker) having a PVD-AR coating deposited by a first commercial coater apparatus and an ETC deposited in a second chamber by a commercial process, such as dipping or spraying. Both coatings were deposited on samples of the same chemically tempered (ion-exchanged) 0.7 mm thick Corning Code 2319 glass. Glass article 220 was coated according to the methods described herein. The commercially available glass article was coated by a commercial coating vendor. The abrasion durability was carried out at a relative humidity of 40%. At the point indicated by arrow 224, only short, shallow scratches, less than 2 mm long, appeared after 8,000 cycles. In contrast, at the point indicated by arrow 226, deep, long scratches, greater than 5 mm long, appeared after only 200 wipes. The test results indicate that the abrasion durability of AR coating-ETC glasses coated as described herein is at least 10 times greater than the durability of commercially available products.

Figure 17B:
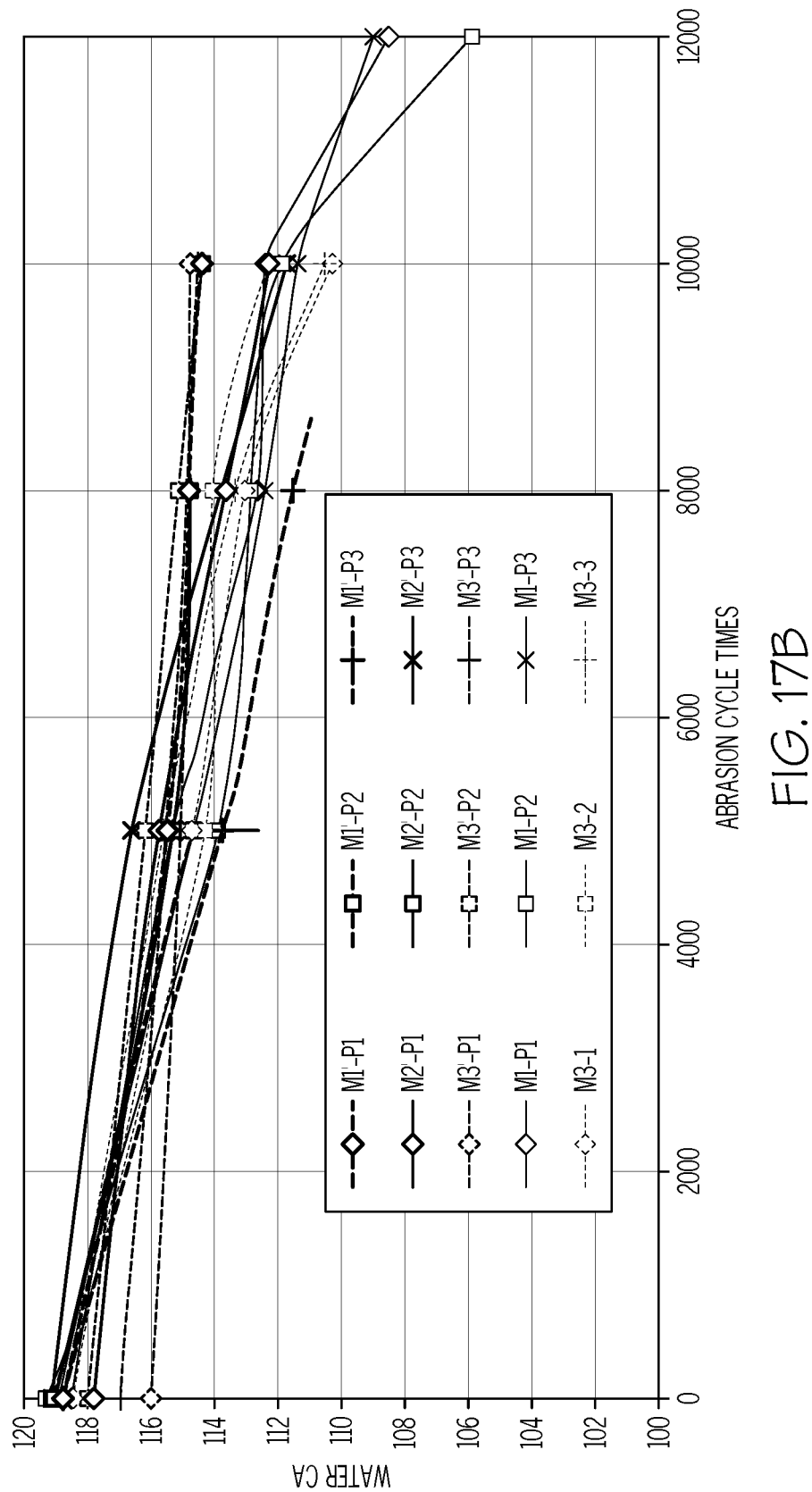
FIG. 17B is a graph of the Water Contact Angle versus Abrasion Cycles illustrating the improvement that is obtained using the mask as illustrated in FIG. 17A.

FIG. 17B graphically depicts the Water Contact Angle versus Abrasion Cycles illustrating the improvement that is obtained using a coating apparatus configured as depicted in FIG. 17A. The water contact angle results can be compared to those of FIGS. 10 and 11. The data in FIG. 17B show that, after 10,000 abrasion cycles, all the substrates illustrated in FIG. 17B have a water contact angle of greater than 110°, and substantially all of the substrates had a water contact angle of 112° or higher. In contrast, the data of FIGS. 10 and 11 indicate that the water contact angles were less than 100° after 10,000 abrasion cycles. Further, the data in FIG. 17B indicates that, for substrates that have been subjected to 12,000 abrasion cycles, the water contact angles of the substrates is greater than 106°.

Figure 12:
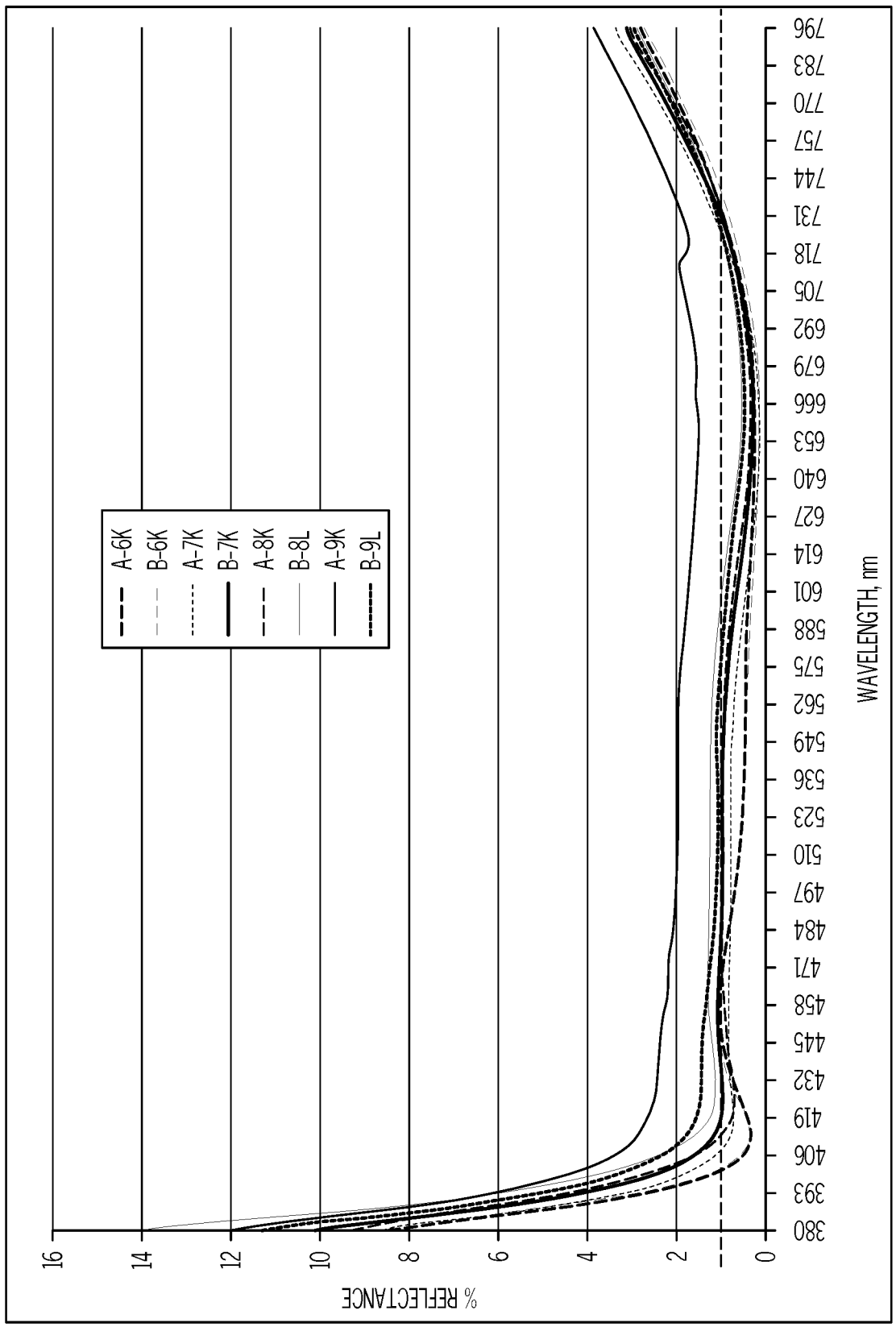
FIG. 12 is a graph of % Reflectance versus wavelength for glass articles coated with an AR coating and an ETC coating after 6K, 7K, 8K and 9K wipes.

FIG. 12 is a graph of % Reflectance versus wavelength, where Reflectance means the percentage of light reflected from the surface of the coated glass article coated with an AR coating and ETC coating as described herein. A new (unabraded or unwiped) article was used for each wiping test. The abrasion/wiping was carried out under following conditions: grade 0000# steel wool, 10 kg load on 10 mm×10 mm area, 60 Hz, 50 mm travel distance, and RH<40%. Reflectance was measured after 6K, 7K, 8K and 9K abrasions. The graph indicates that new articles and articles wiped up to 8K wipes have substantially the same reflectance. After 8K wipes, the reflectance increases. This reflection increase is believed to be due to slight abrasion of the glass surface as a result of a large number of wipes. In the graph, the letter "A" means "After Wiping" and the letter "B" means "Before Wiping" (zero wipes). The letter "K" means "kilo" or "thousand".

Figure 13:
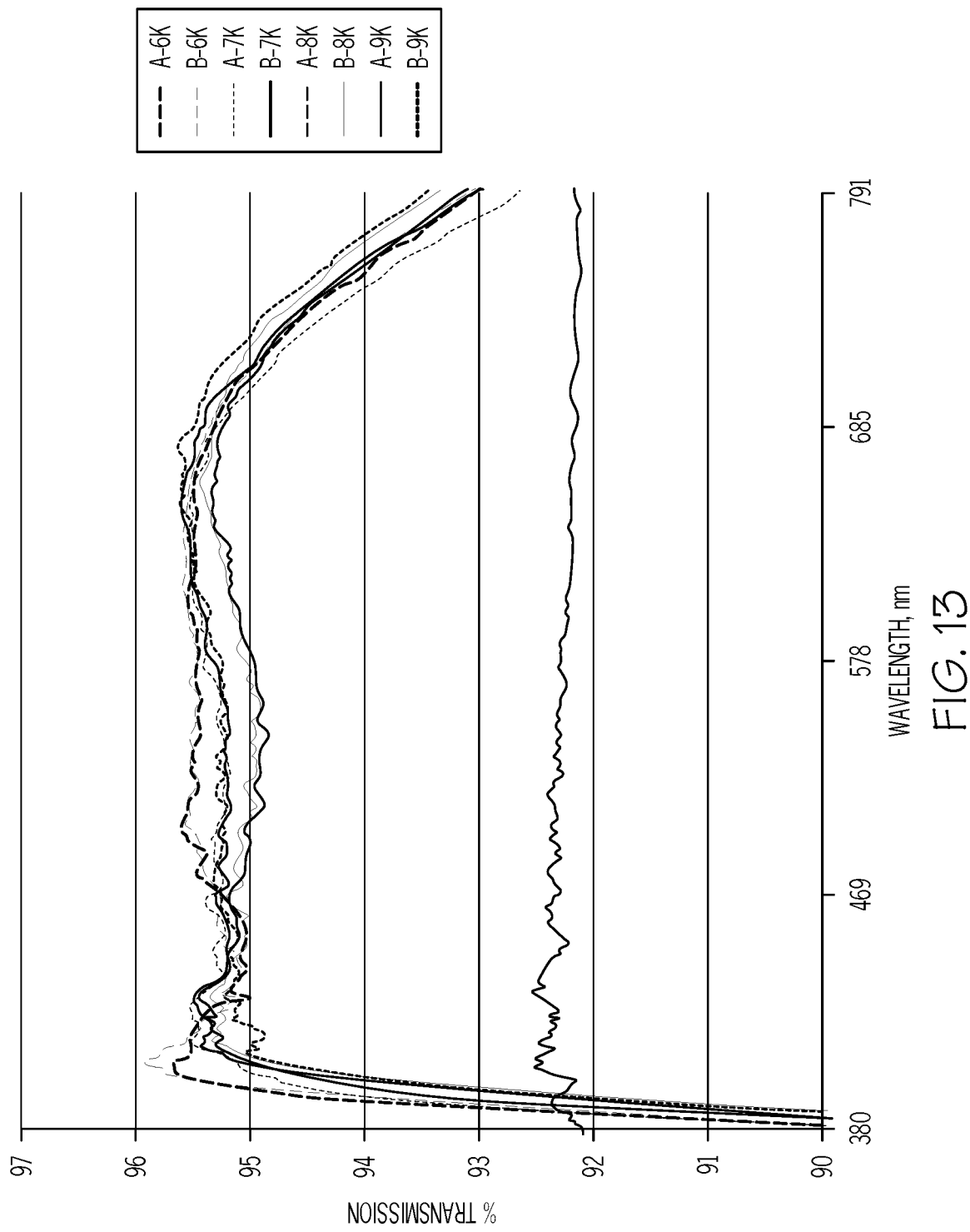
FIG. 13 is a graph of % Transmission versus wavelength for glass articles with an AR coating and an ETC coating after 6K, 7K, 8K and 9K wipes.

FIG. 13 is a graph of % Transmission versus wavelength. The testing was performed on coated glass articles coated with an AR coating and ETC coating as described herein. A new (unabraded or unwiped) article was used for each wiping test. The transmission test used the same articles as the reflectance test. The graph indicates that new articles and articles wiped up to 8K wipes have substantially similar transmissions, the transmission being in the range of 95-96%. After 8K wipes, the transmission falls to approximate 92% over the entire wavelength range. This transmission decrease is believed due to slight abrasion of the glass surface as a result of a large number of wipes. In the graph, the letter "A" means "After wiping" and the letter "B" means "Before wiping" (zero wipes). The letter "K" means "kilo" or "thousand".

The data in FIGS. 12 and 13 indicates that the optical coating on the glass articles is highly durable, in addition to having excellent water contact angle retention, as is shown by FIGS. 10 and 11.

Figure 14:
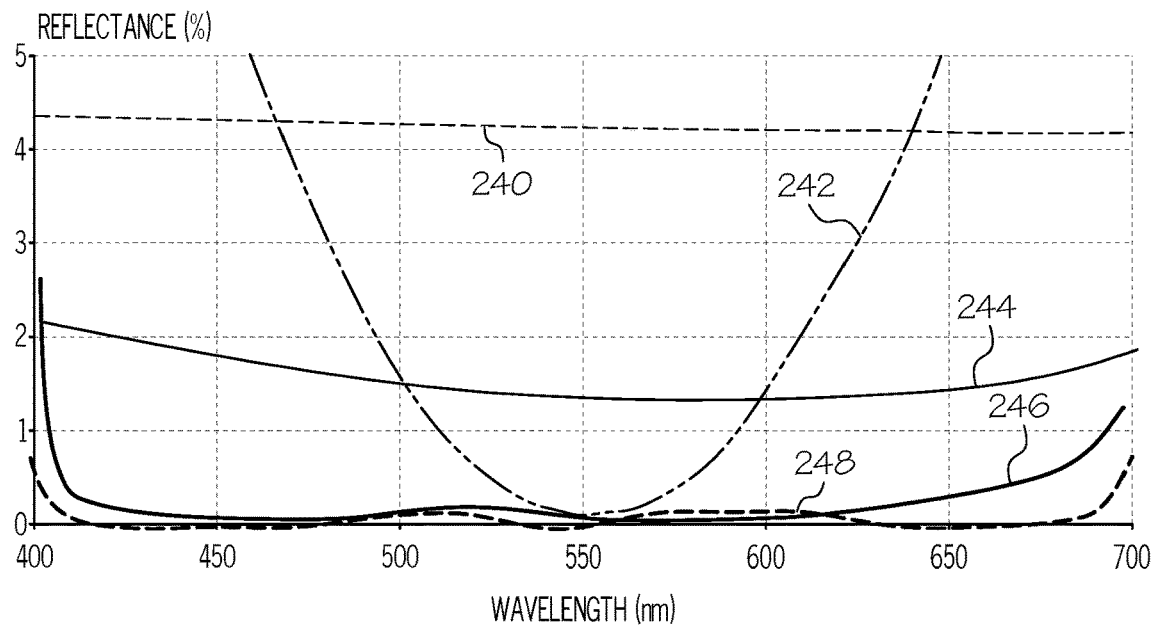
FIG. 14 is a graph of Reflectance % versus wavelength and illustrating the effect of the numbers of AR coating layers/periods reflectance versus glass without an AR coating.

FIG. 14 is a graph of Reflectance % versus wavelength illustrating the effect of the numbers of AR coating layers/periods on reflectance relative to glass without an AR coating. Curve 240 represents uncoated ion-exchanged glass, Corning Code 2319. Curve 244 is a 2-layer, or 1-period, coating consisting of $SiO_2/Nb_2O_3$. Curves 246 and 248 are 4-layer (2 periods) and 6-layer (3 periods) coatings consisting of $SiO_2$/Nb2O3 layer pairs. Curve 242 is a 1-layer coating of $Nb_2O_3$. The data indicates that increasing the AR coating stack number (layers/periods) will broaden the utility of the AR coating spectral range and will also decrease the Reflectance %.

Example 3

Figure 18:
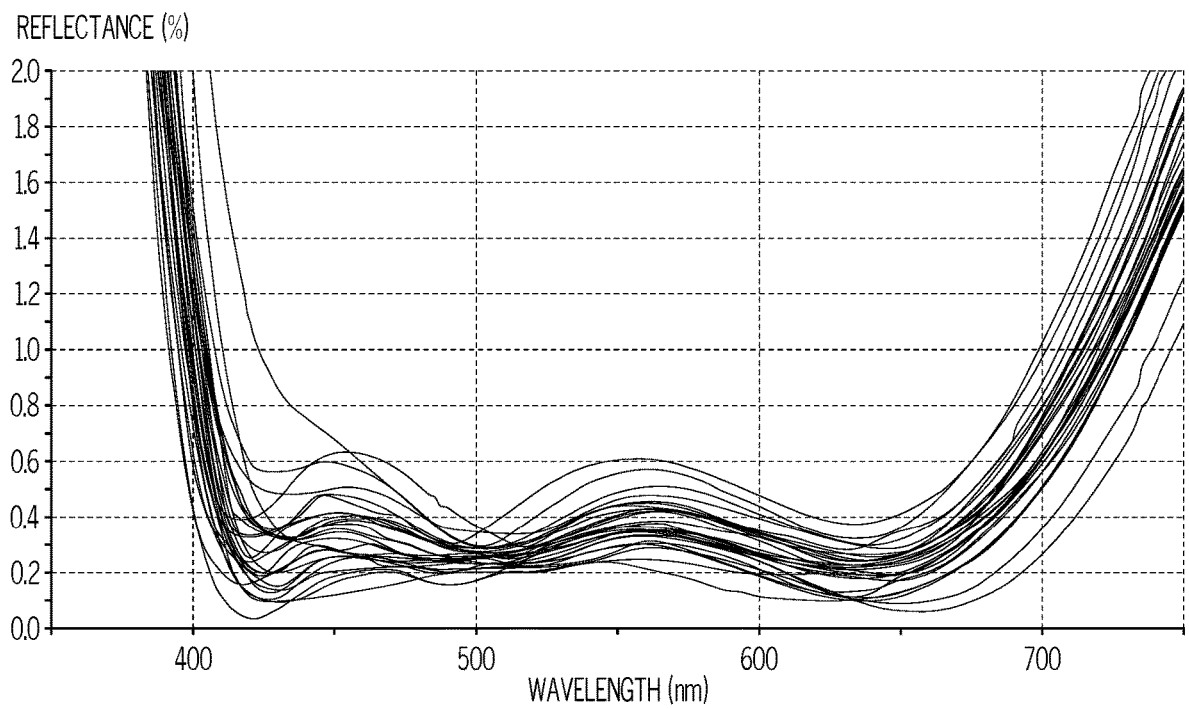
FIG. 18 is a simulation of the reflectance (y-axis) as a function of wavelength (x-axis) for a glass substrate coated with a 6 layer AR coating ($Nb_2O_5/SiO_2$) and an ETC coating with the AR coating having a thickness variation of 2%.
Figure 19:
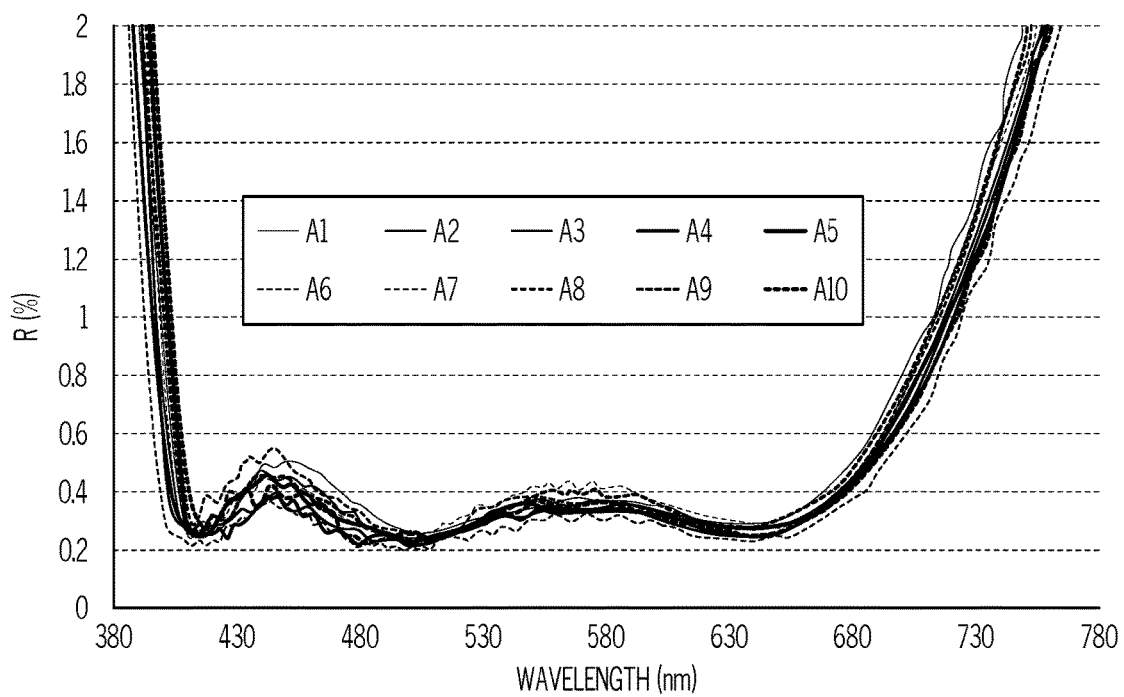
FIG. 19 graphically depicts the reflectance (y-axis) as a function of wavelength for a plurality of actual samples coated with a 6 layer AR coating ($Nb_2O_5/SiO_2$) and an ETC coating.

FIG. 18 is a computer simulation of the reflectance (y-axis) as a function of wavelength (x-axis) for a glass substrates coated with a 6 layer AR coating ($Nb_2O_5/SiO_2$) and an ETC coating. The AR coating was simulated with a thickness variation of 2%. Accordingly, the resultant reflectance profile simulates the reflectance of a 6 layer AR coating ($Nb_2O_5/SiO_2$) and an ETC coating where the ETC coating has a thickness variation of 2%. FIG. 19 graphically depicts the reflectance (y-axis) as a function of wavelength for a plurality of actual samples coated with a 6 layer AR coating ($Nb_2O_5/SiO_2$) and an ETC coating using the methods and apparatuses described herein. As depicted in FIG. 19, the reflectance profile of the actual samples is similar to the reflectance profile of the simulated samples, thus indicating that the samples coated using the methods described have an optical coating in which the thickness variation of the optical coating across the coated substrate (i.e., from the first edge to second edge of the optical coating) is less than 3%.

The AR/ETC coating described herein can be utilized in many commercial articles. For example, the resulting coating can be used to make televisions, cell phones, electronic tablets, book readers and other devices readable in sunlight. The AR/EC coatings also have utility in antireflection beamsplitters, prisms, mirrors and laser products; optical fibers and components for telecommunication; optical coatings for use in biological and medical applications; and for antimicrobial surfaces.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

We claim:
1. A method comprising:
releasably affixing a glass substrate comprising a first surface and a second surface on a substrate retention area of a substrate retention surface of a substrate carrier, wherein (i) the substrate carrier further comprises an underside facing an opposite direction as the substrate retention surface, (ii) the substrate retention area faces the first surface of the glass substrate, and (iii) the first surface and the second surface of the glass substrate face in opposite directions;
magnetically attaching the substrate carrier having the glass substrate thereon to a rotatable dome within a vacuum chamber so that the underside of the substrate carrier faces the rotatable dome and the second surface of the glass substrate can be coated with an optical coating and an easy-to-clean (ETC) coating, wherein the substrate carrier does not include elements that project beyond the second surface of the glass substrate;
evacuating the vacuum chamber;
rotating the rotatable dome and depositing the optical coating on the second surface of the glass substrate;
rotating the rotatable dome and depositing the ETC coating on top of the optical coating following deposition of the optical coating, wherein the optical coating is not exposed to ambient atmosphere prior to the deposition of the ETC coating; and
removing the glass substrate having the optical coating and the ETC coating from the vacuum chamber to obtain a glass substrate having a uniform optical coating deposited on the glass substrate and the ETC coating deposited on the optical coating.

2. The method according to claim 1, wherein an adhesive material is positioned over the substrate retention surface in the substrate retention area to releasably affix the glass substrate to the substrate retention surface.

3. The method according to claim 2, wherein, before releasably affixing the glass substrate to the substrate carrier, the substrate carrier further comprises a polymer film positioned between the substrate retention surface and the adhesive material.

4. The method according to claim 3, wherein the polymer film comprises a thermoplastic polymer film.

5. The method according to claim 3, wherein the polymer film is a static film.

6. The method according to claim 2, wherein the adhesive material is a pressure sensitive adhesive.

7. The method according to claim 2, wherein the adhesive material is selected from the group consisting of acrylic adhesives, rubber adhesives, and silicone adhesives.

8. The method according to claim 2, wherein
before magnetically attaching the substrate carrier to the rotatable dome, the substrate carrier further comprises a plurality of magnets extending from the underside of the substrate carrier; and
magnetically attaching the substrate carrier having the glass substrate loaded thereon to the rotatable dome comprises using the plurality of magnets, and further wherein the plurality of magnets are positioned outside of a perimeter of the substrate retention area.

9. The method of claim 8, wherein the plurality of magnets of the substrate carrier off-set the substrate carrier a distance from the rotatable dome.

10. The method according to claim 1, further comprising:
positioning the glass substrate on the substrate retention surface and supporting the glass substrate with a plurality of pins extending from the substrate retention area, wherein, the substrate carrier further comprises a spring system comprising a retractable pin held in place by a spring which biases the retractable pin into contact with the glass substrate when the glass substrate is positioned on the substrate retention surface, and a plurality of side stoppers extending from the substrate retention surface for a distance such that tops of the plurality of side stoppers do not extend beyond the second side of the glass substrate.

11. The method of claim 10, wherein the retractable pin is closer to an axis of rotation of the rotatable dome than the plurality of pins.

12. The method according to claim 1 further comprising:
supporting the glass substrate on the substrate retention surface with a plurality of pins extending from the substrate retention area,
wherein, the substrate carrier further comprises a housing with a retractable pin disposed in the housing, wherein the retractable pin is held in place by a spring, the retractable pin being outwardly biased from the housing and into contact with the glass substrate when the substrate is positioned on the substrate retention surface, and a plurality of movable pins for holding an edge of the glass substrate when the glass substrate is positioned on the substrate retention surface, wherein positions of the plurality of moveable pins are adjustable to accommodate glass substrates of different shapes and dimensions.

13. The method according to claim 1, further comprising curing the ETC coating in air at room temperature or by heating the ETC coating.

14. The method according to claim 1, wherein the vacuum chamber is evacuated to a pressure of less than or equal to $10^{-4}$ Torr.

15. The method according to claim 1 further comprising densifying the optical coating as the optical coating is deposited.

16. The method according to claim 1, wherein the vacuum chamber contains at least one e-beam source for vaporizing source materials for the optical coating.

17. The method according to claim 1, wherein depositing the optical coating comprises depositing a multilayer optical coating comprising at least one period of a high refractive index material and a low refractive index material, wherein:
the high refractive index material is selected from the group consisting of $ZrO_2$, $HfO_2$, $Ta_2O_5$, $Nb_2O_5$, $TiO_2$, $Y_2O_3$, $Si_3N_4$, SrTiO3, and $WO_3$; and
the low refractive index material is selected from the group consisting of $SiO_2$, $MgF_2$, $YF_3$, $YbF_3$ and $Al_2O_3$.

18. The method according to claim 1, wherein the glass substrate is formed from ion-exchanged silica glass, non-ion-exchanged silica glass, aluminosilicate glass, borosilicate glass, aluminoborosilicate glass, or soda lime glass.

19. The method according to claim 1, wherein source material for the ETC coating is a alkyl perfluorocarbon silane of formula $(R_F)_xSiX_{4-x}$, where $R_F$ is a linear $C_6$-$C_{30}$ alkyl perfluorocarbon, X=Cl or —$OCH_3$— and x=2 or 3.

20. The method according to claim 1, wherein a variation in a thickness of the optical coating from a first edge of the optical coating to second edge of the optical coating of the glass substrate is less than or equal to 2%.

21. The method of claim 1, wherein the glass substrate is releasably affixed to the substrate carrier via a statically charged polymer film.

22. A method comprising:
releasably affixing a first surface of a glass substrate to a substrate retention surface of a substrate carrier, the substrate carrier further comprising (i) an underside that faces an opposite direction as the substrate retention surface and (ii) a plurality of magnets extending from the underside;
magnetically attaching, with the plurality of magnets, the substrate carrier with the glass substrate releasably affixed thereto onto a rotatable dome positioned within a vacuum chamber, with the underside of the substrate carrier facing the rotatable dome; and
while the substrate carrier with the glass substrate is attached to the rotatable dome, evacuating the vacuum chamber and rotating the rotatable dome;
while rotating the rotatable dome, sequentially (i) applying an anti-reflective coating to a second surface of the glass substrate, the second surface of the glass substrate facing an opposite direction as the first surface and (ii) applying an easy-to-clean coating to the glass substrate, with the anti-reflective coating disposed between the glass substrate and the easy-to-clean coating;
wherein, no feature of the substrate carrier projects beyond the second surface of the glass substrate.

23. The method of claim 22, wherein the substrate retention surface comprises a statically charged polymer film, a layer of adhesive material, or both that is utilized to releasably affix the first surface of the glass substrate to the substrate carrier.

24. The method of claim 22, wherein the plurality of magnets are positioned outside of a perimeter that the glass substrate defines through the substrate carrier.

* * * * *

UNITED STATES PATENT AND TRADEMARK OFFICE
CERTIFICATE OF CORRECTION

PATENT NO. : 11,180,410 B2
APPLICATION NO. : 16/128048
DATED : November 23, 2021
INVENTOR(S) : Christopher Morton Lee et al.

Page 1 of 1

It is certified that error appears in the above-identified patent and that said Letters Patent is hereby corrected as shown below:

In the Specification

In Column 1, Line 10, delete "and" and insert -- which --, therefor.

In the Claims

In Column 27, Line 50, Claim 12, delete "moveable" and insert -- movable --, therefor.

In Column 28, Line 11, Claim 17, delete "SrTiO3," and insert -- $SrTiO_3$, --, therefor.

Signed and Sealed this
Twenty-fifth Day of July, 2023

Katherine Kelly Vidal
*Director of the United States Patent and Trademark Office*